United States Patent
MacDonald et al.

(10) Patent No.: US 11,545,410 B2
(45) Date of Patent: Jan. 3, 2023

(54) ENHANCED SYSTEMS AND METHODS FOR IMPROVED HEAT TRANSFER FROM SEMICONDUCTOR PACKAGES

(71) Applicant: Intel Corporation, Santa Clara, CA (US)

(72) Inventors: Mark MacDonald, Beaverton, OR (US); David Pidwerbecki, Hillsboro, OR (US); Mark Gallina, Hillsboro, OR (US); Jerrod Peterson, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 123 days.

(21) Appl. No.: 16/222,854

(22) Filed: Dec. 17, 2018

(65) Prior Publication Data
US 2019/0139855 A1     May 9, 2019

(51) Int. Cl.
*H01L 23/34*      (2006.01)
*H01L 23/367*     (2006.01)
(Continued)

(52) U.S. Cl.
CPC ...... *H01L 23/3675* (2013.01); *H01L 23/3736* (2013.01); *H01L 23/42* (2013.01);
(Continued)

(58) Field of Classification Search
CPC ..... H01L 23/42; H01L 23/3672; H01L 23/40; H01L 23/3736; H01L 2224/73253;
(Continued)

(56) References Cited

U.S. PATENT DOCUMENTS 4,233,645 A * 11/1980 Balderes ............. H01L 23/3733
174/16.3
4,323,914 A * 4/1982 Berndlmaier ......... H01L 23/057
257/697

(Continued)

FOREIGN PATENT DOCUMENTS

CN         1798818 B   *   5/2010   ............... C09J 7/35

*Primary Examiner* — Mary A Wilczewski
*Assistant Examiner* — Tsz K Chiu
(74) *Attorney, Agent, or Firm* — Hanley, Flight & Zimmerman, LLC

(57) ABSTRACT

Enhanced thermal energy transfer systems for semiconductor packages are provided. A thermally conductive member is disposed in the interstitial space between an upper surface of a semiconductor package and a lower surface of a thermal member. The thermally conductive member is disposed above a first portion of the upper surface of the semiconductor package having a relatively higher thermal energy output when the semiconductor package is operating. A thermal interface material is disposed in the interstitial space and a force applied to the thermal member. The thermally conductive member forms a relatively higher pressure region above the first portion of the semiconductor package and a relatively lower pressure region in other portions of the semiconductor package remote from the thermally conductive member. The increased pressure region proximate the thermally conductive member beneficially enhances the flow of thermal energy from the first portion of the semiconductor package to the thermal member.

19 Claims, 12 Drawing Sheets

(51) Int. Cl.
    *H01L 23/373*    (2006.01)
    *H01L 23/42*     (2006.01)
    *H01L 23/40*         (2006.01)
    *H01L 23/24*         (2006.01)
    *H01L 23/473*        (2006.01)

(52) U.S. Cl.
    CPC .......... *H01L 23/24* (2013.01); *H01L 23/3672* (2013.01); *H01L 23/40* (2013.01); *H01L 23/473* (2013.01); *H01L 2224/73253* (2013.01)

(58) Field of Classification Search
    CPC ......... H01L 23/473; H01L 2224/16225; H01L 2224/32225; H01L 2224/73204; H01L 2924/15311; H01L 23/3675; H01L 2924/00; H01L 21/4882; H01L 21/52; H01L 21/67132; H01L 21/6835; H01L 2224/27436; H01L 2224/27602; H01L 2224/29013; H01L 2224/29014; H01L 2224/29076; H01L 2224/32245; H01L 2224/3303; H01L 2224/33051; H01L 2224/33505; H01L 2224/83192; H01L 23/16; H01L 23/3737; H01L 23/552; H01L 23/562; H01L 24/27; H01L 24/33; H01L 24/743; H01L 24/97; H01L 2924/16152; H01L 2924/3511; H01L 31/0203
    See application file for complete search history.

(56) References Cited

U.S. PATENT DOCUMENTS

| | | | | |
|---|---|---|---|---|
| 5,931,222 A * | 8/1999 | Toy | ............................ | F28F 3/02 165/80.3 |
| 5,990,418 A * | 11/1999 | Bivona | .................... | H01L 23/16 174/546 |
| 6,472,742 B1 * | 10/2002 | Bhatia | ..................... | H01L 23/40 257/706 |
| 9,148,946 B1 * | 9/2015 | Singh | ................. | H05K 7/20436 |
| 9,472,485 B2 * | 10/2016 | Saeidi | ..................... | H01L 23/16 |
| 10,643,924 B1 * | 5/2020 | Shen | .................... | H01L 23/3675 |
| 2002/0051342 A1 * | 5/2002 | Kanada | ................... | H01L 23/42 361/705 |
| 2002/0074649 A1 * | 6/2002 | Chrysler | ................ | H01L 21/049 257/E23.101 |
| 2002/0079571 A1 * | 6/2002 | Takeuchi | .............. | H01L 23/4338 257/E23.087 |
| 2007/0056620 A1 * | 3/2007 | Bahr | ....................... | H01L 23/38 136/201 |
| 2007/0056621 A1 * | 3/2007 | Baskaran | ................ | H01L 35/16 136/203 |
| 2008/0196875 A1 * | 8/2008 | Kurtz | ...................... | F28F 3/048 257/E23.098 |
| 2009/0284921 A1 * | 11/2009 | Colgan | ................. | H01L 23/473 361/699 |
| 2011/0176280 A1 * | 7/2011 | Lee | ...................... | H01L 23/3677 361/721 |
| 2012/0160449 A1 * | 6/2012 | Fowler | ............... | H05K 7/20509 165/80.2 |
| 2012/0206880 A1 * | 8/2012 | Andres | ............... | H01L 23/4275 361/700 |
| 2014/0138854 A1 * | 5/2014 | Arora | .................. | H01L 23/3737 257/782 |
| 2015/0000868 A1 * | 1/2015 | Sri-Jayantha | ....... | H01L 23/4093 165/76 |
| 2015/0035134 A1 * | 2/2015 | Hung | ...................... | H01L 24/32 257/712 |
| 2015/0043168 A1 * | 2/2015 | Douglas | ................ | H01L 23/427 165/185 |
| 2015/0187679 A1 * | 7/2015 | Ho | ........................ | H01L 23/367 257/690 |
| 2015/0279761 A1 * | 10/2015 | Bet-Shliemoun | ........ | H01L 23/42 257/714 |
| 2017/0074731 A1 * | 3/2017 | Santhanagopalan | ... | G01N 25/20 |
| 2017/0142861 A1 * | 5/2017 | McLaughlin | .............. | G06F 1/20 |
| 2018/0374715 A1 * | 12/2018 | Stathakis | .............. | H01L 23/373 |
| 2018/0374716 A1 * | 12/2018 | Stathakis | .............. | H01L 23/373 |
| 2019/0045663 A1 * | 2/2019 | Shia | ...................... | H01L 23/427 |
| 2019/0269005 A1 * | 8/2019 | He | ....................... | H01L 23/4006 |
| 2020/0066669 A1 * | 2/2020 | Fry | ........................ | H01L 43/02 |

* cited by examiner

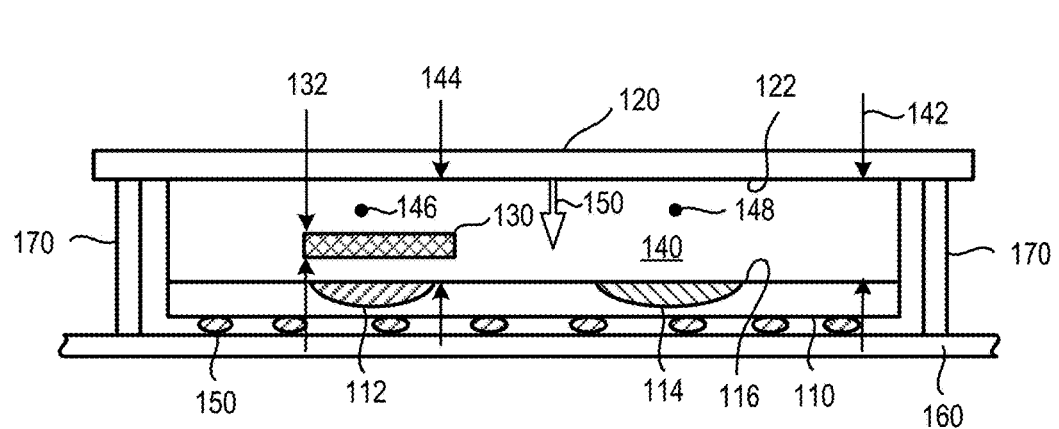
FIG. 1B₁
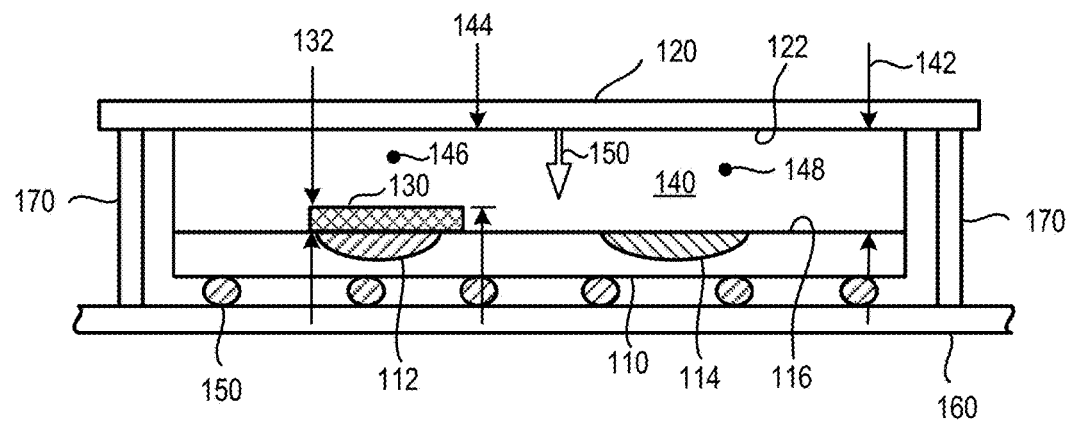
FIG. 1B₂
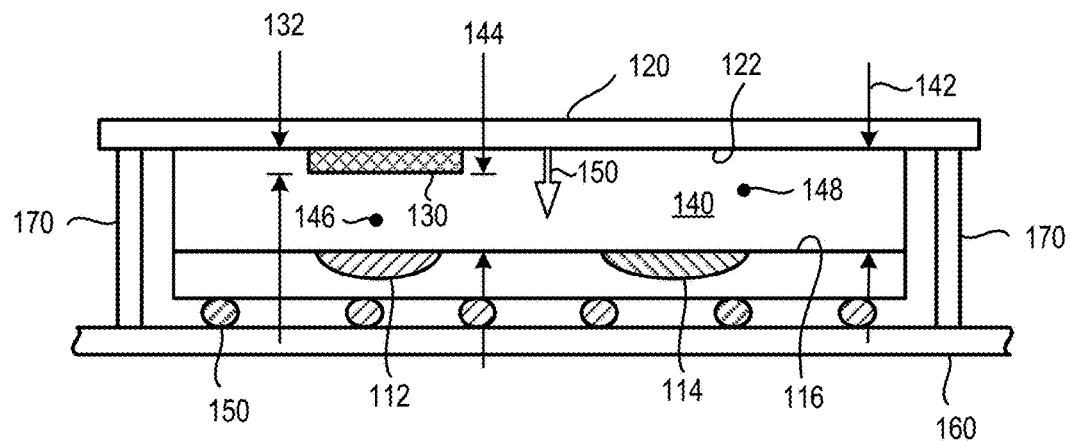
FIG. 1B₃

ENHANCED SYSTEMS AND METHODS FOR IMPROVED HEAT TRANSFER FROM SEMICONDUCTOR PACKAGES

TECHNICAL FIELD

The present disclosure relates to heat transfer systems, more specifically heat transfer systems useful with semiconductor packages.

BACKGROUND

The compact electronic packaging required by increasingly smaller handheld and portable devices frequently requires the use of smaller footprint semiconductor packages. Such smaller footprint semiconductor packages typically include a number of semiconductor dies, at least a portion of which may generate significant heat when operating. The relatively small housings used portable electronic devices limit possible thermal dissipation solutions. Some devices include a cold plate or similar thermally conductive structure to dissipate localized heat generated by a semiconductor die over a larger surface area to limit the temperature rise of the semiconductor die when operating. SoC package thermal performance depends upon the ability to minimize the thermal resistance between the thermal solution (e.g., an active or passive heat dissipation device) and the semiconductor die.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1A:
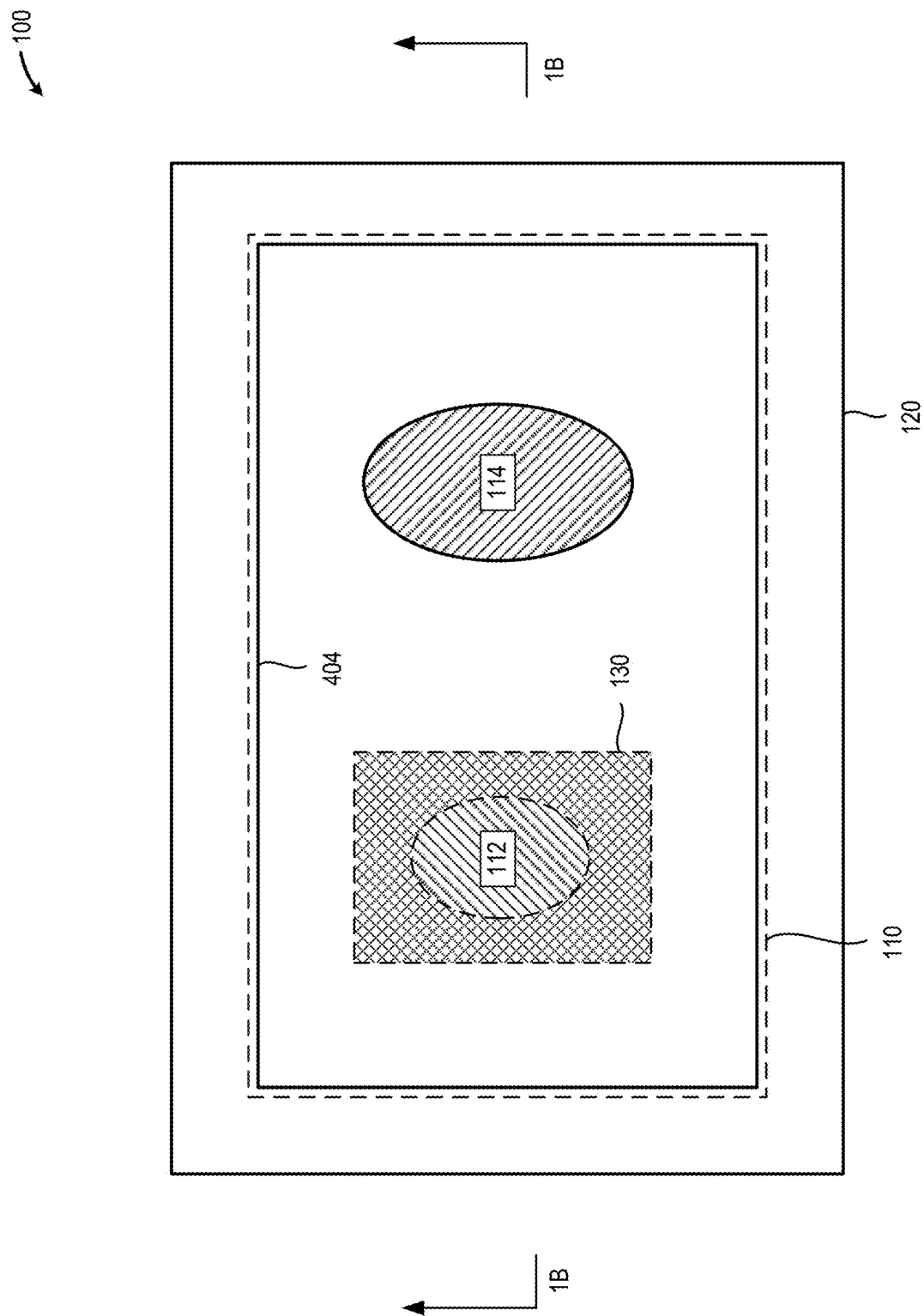
FIG. 1A provides a plan view of an illustrative system that includes a semiconductor die having a thermal member disposed a distance above the upper surface of the semiconductor die, a thermally conductive member is disposed between the semiconductor package and the thermal member proximate a portion of the upper surface of the semiconductor package having a relatively high thermal generation when the semiconductor package is operating, in accordance with at least one embodiment described herein.
Figure 2:
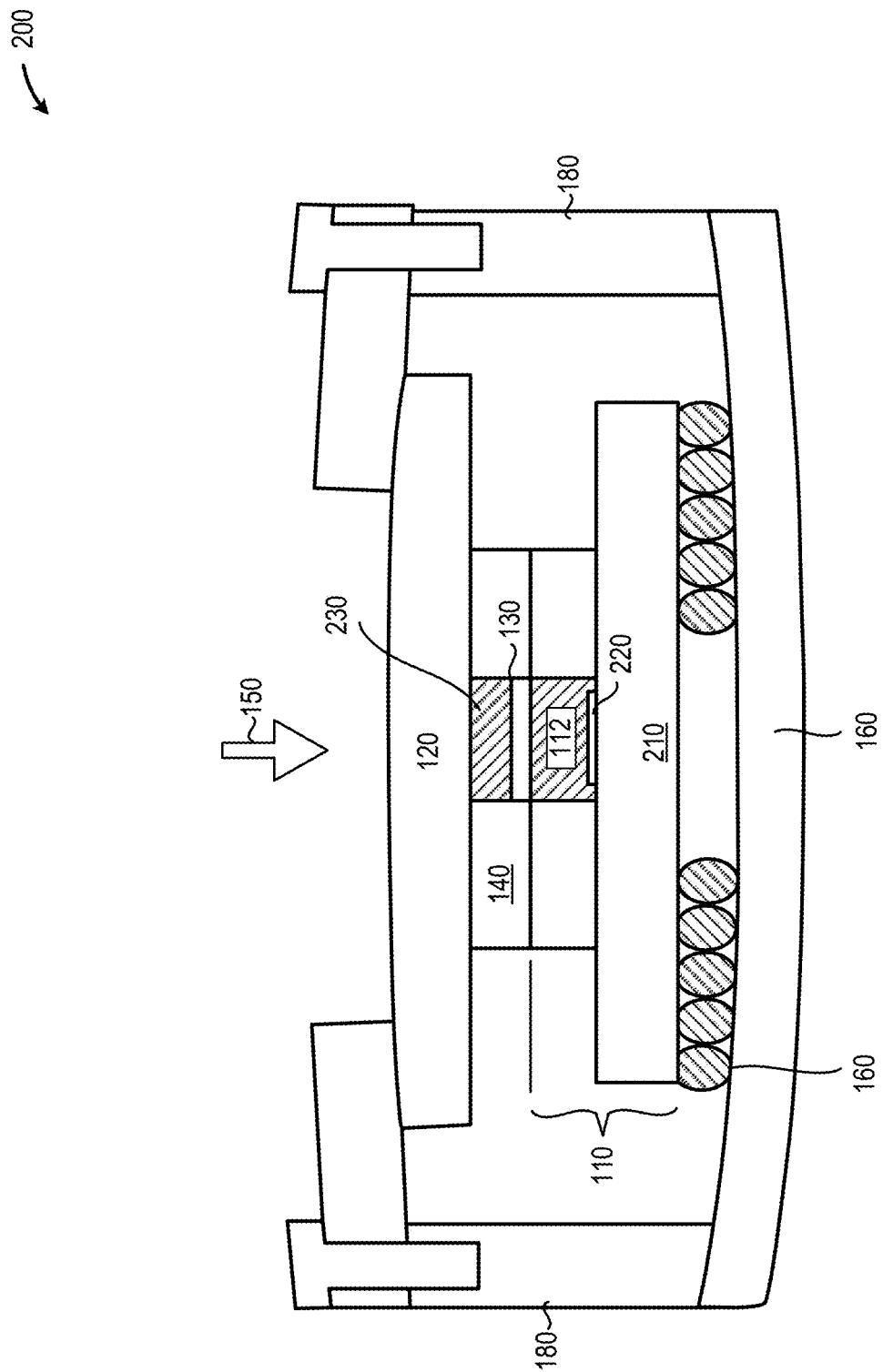
Figure 3:
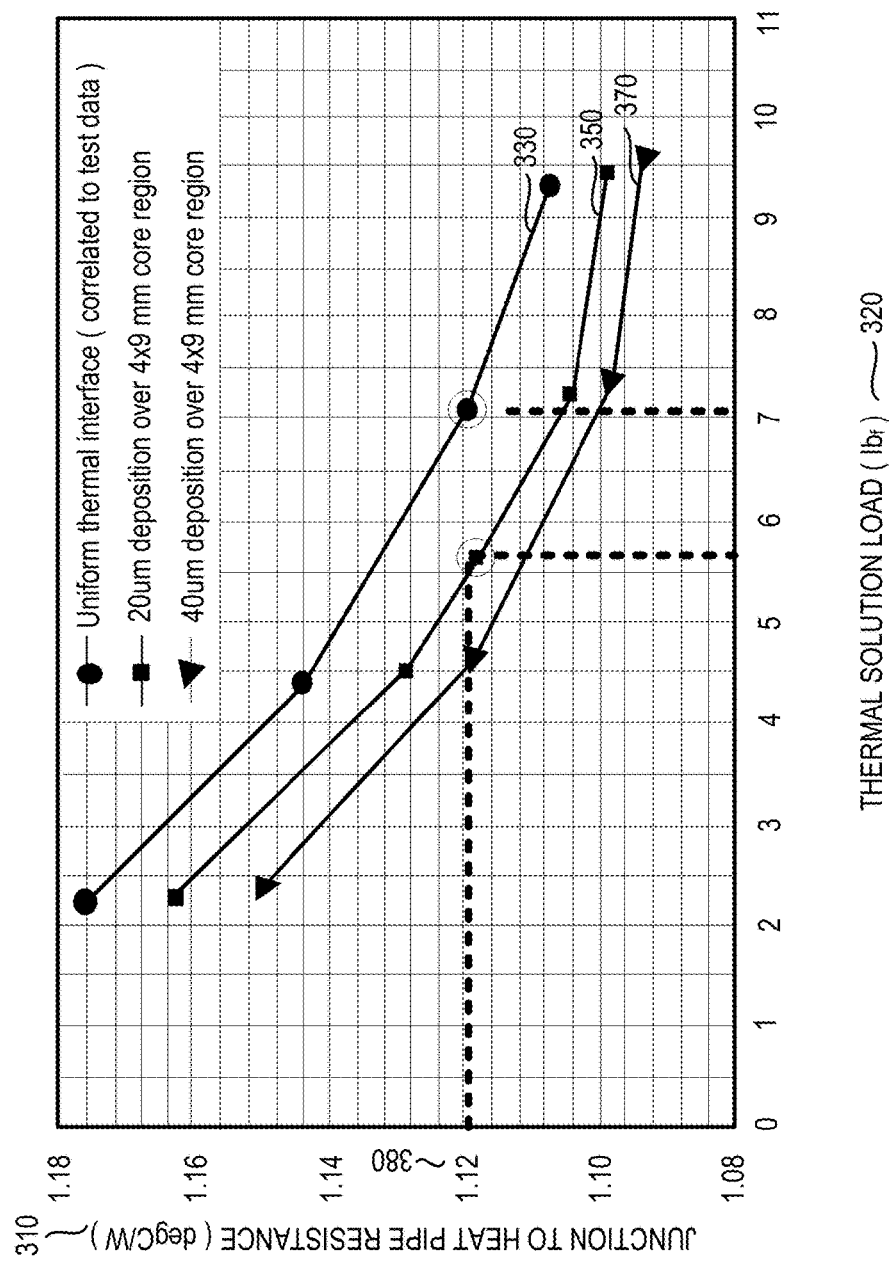
Figure 4:
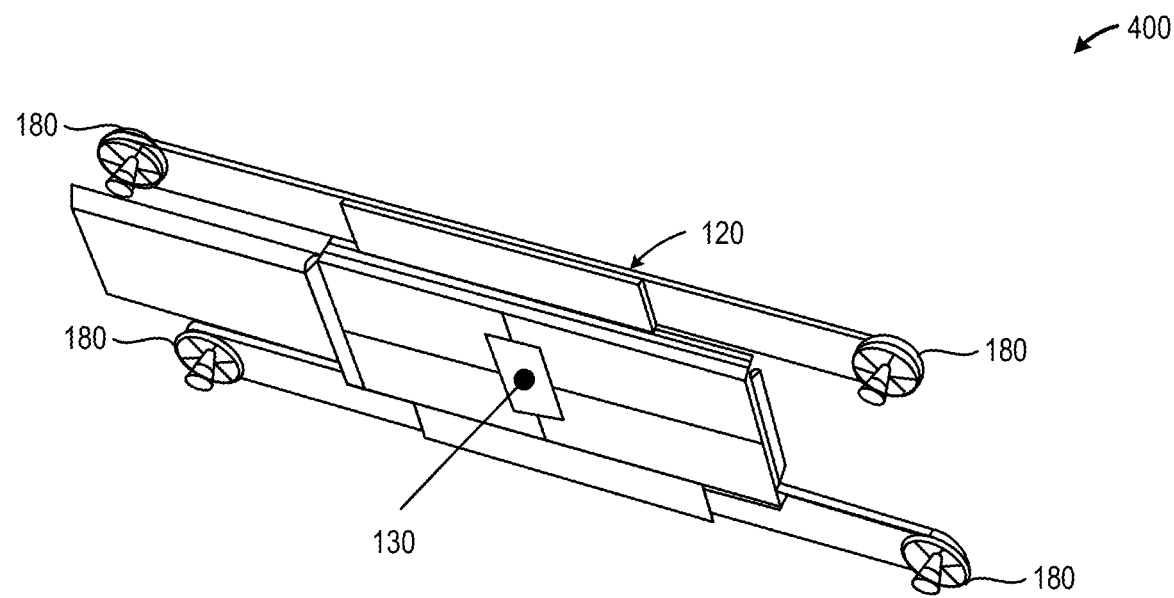
Figure 5:
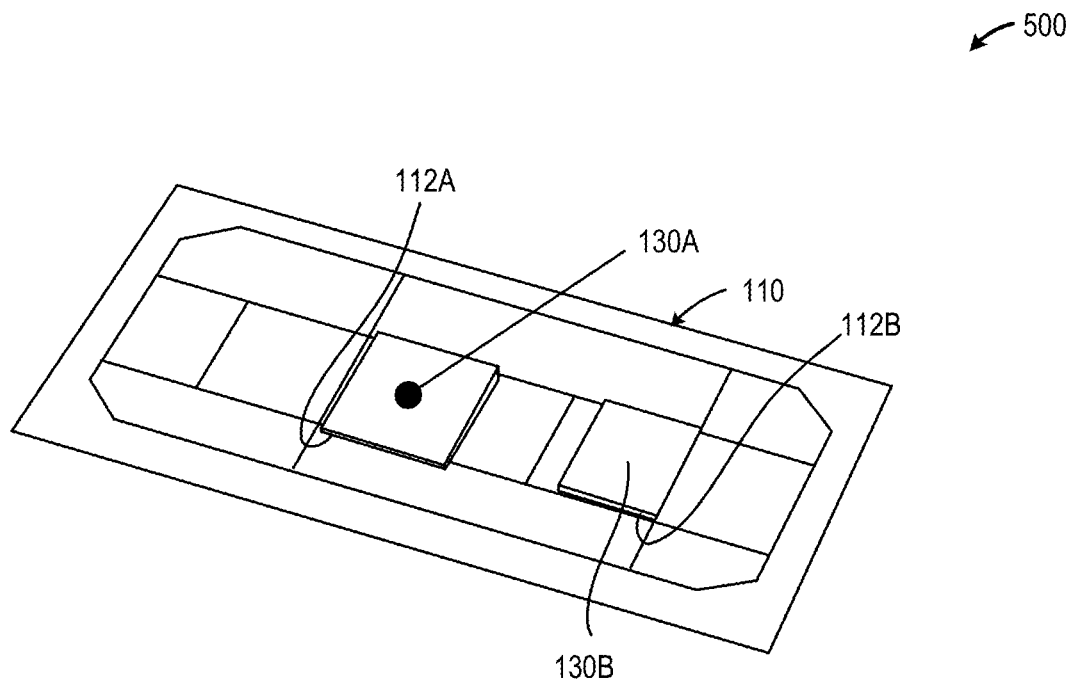
Figure 6A:
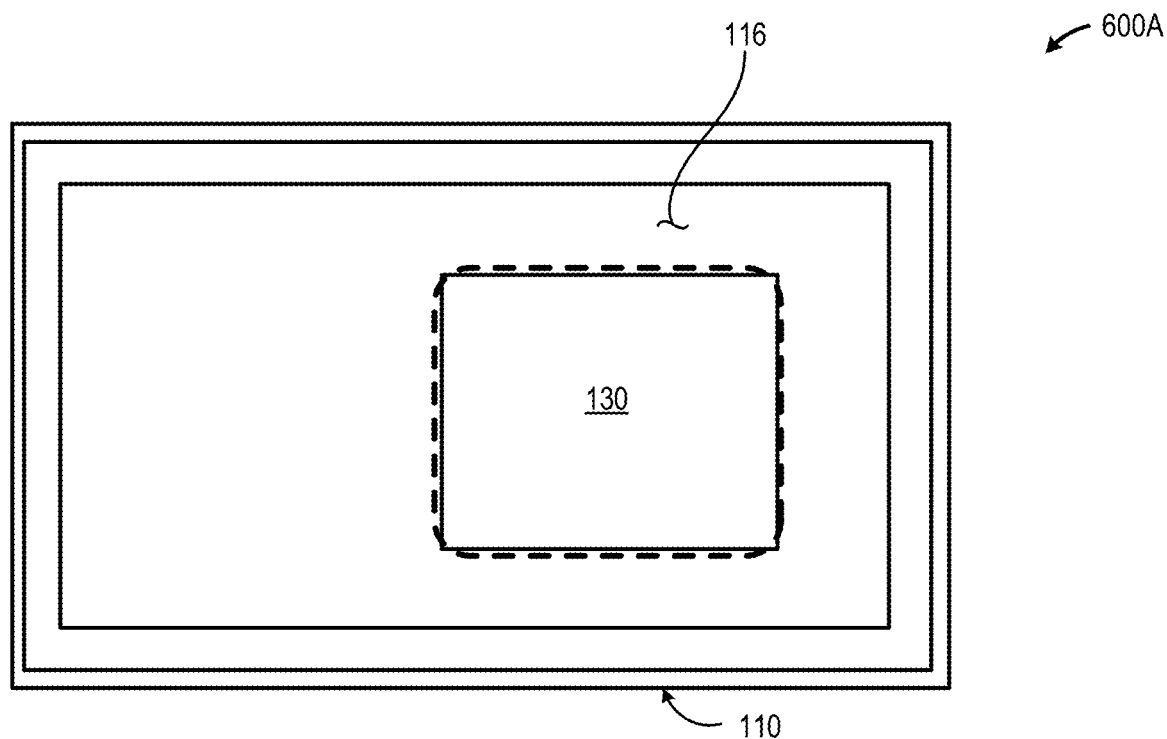
Figure 6B:
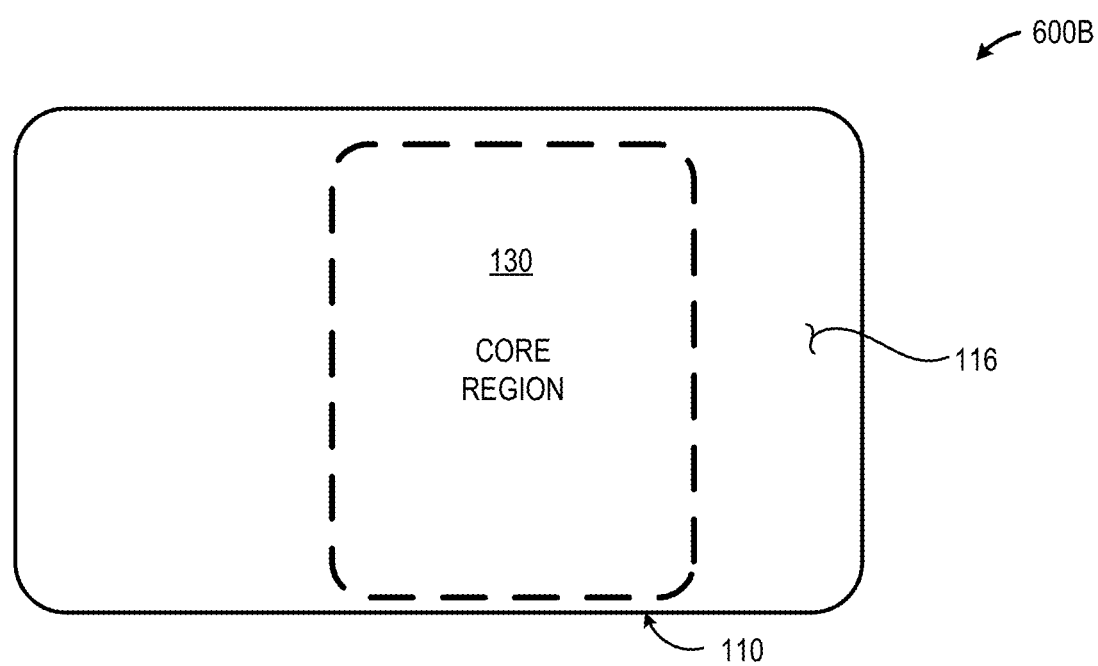
Figure 6C:
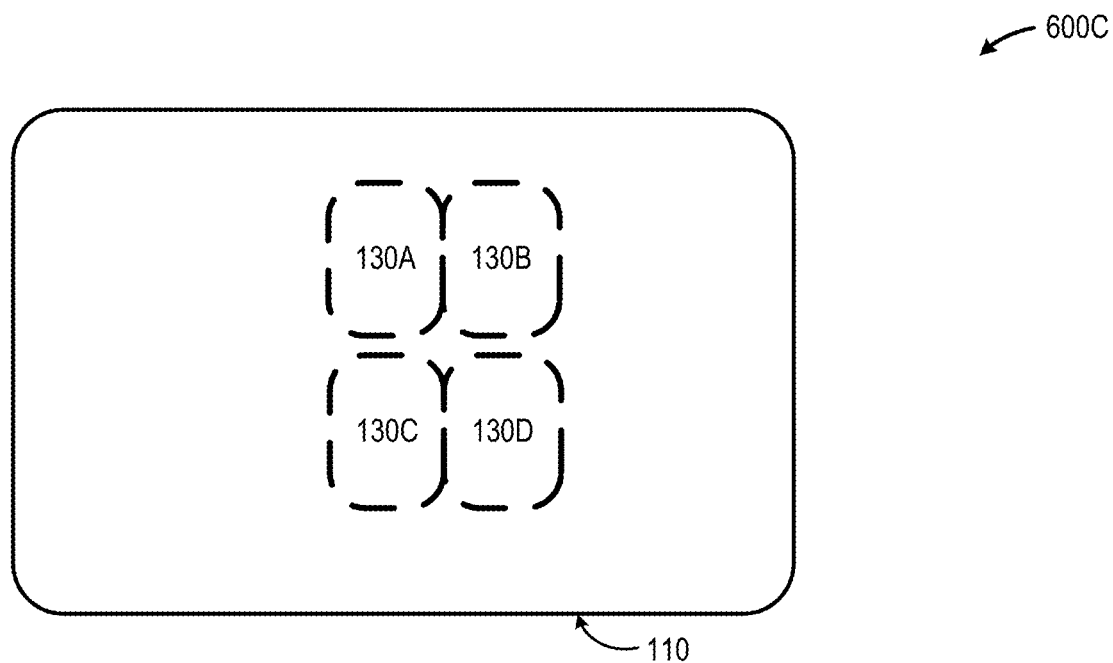
Figure 6D:
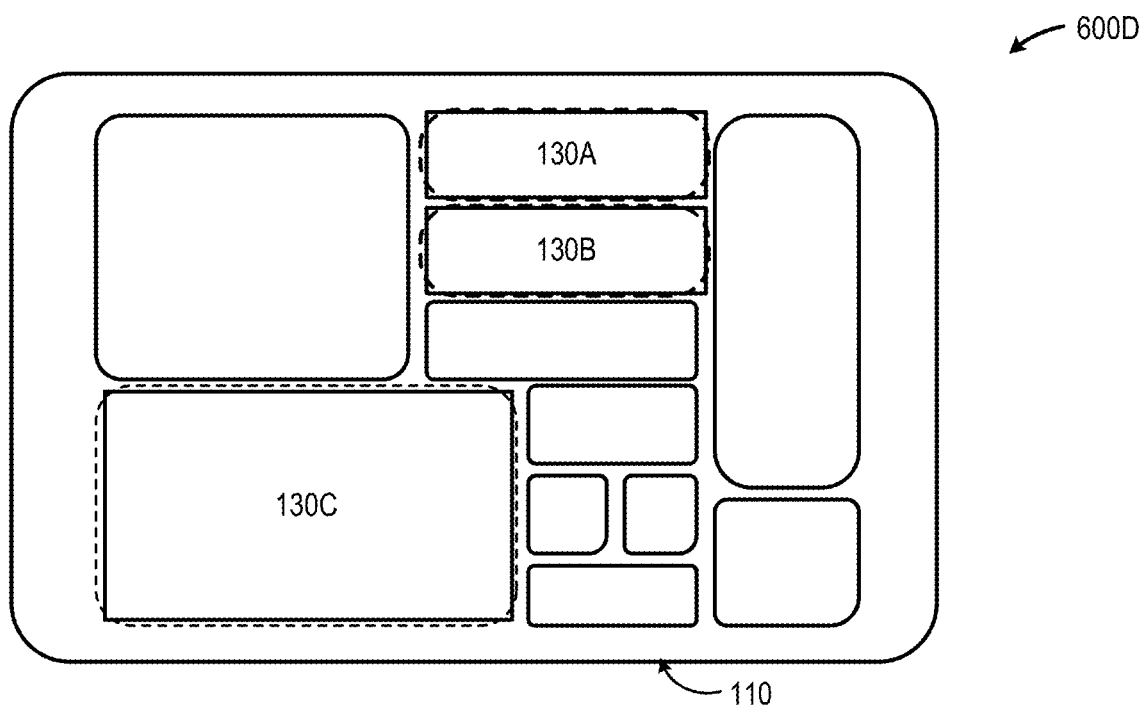
Figure 7:
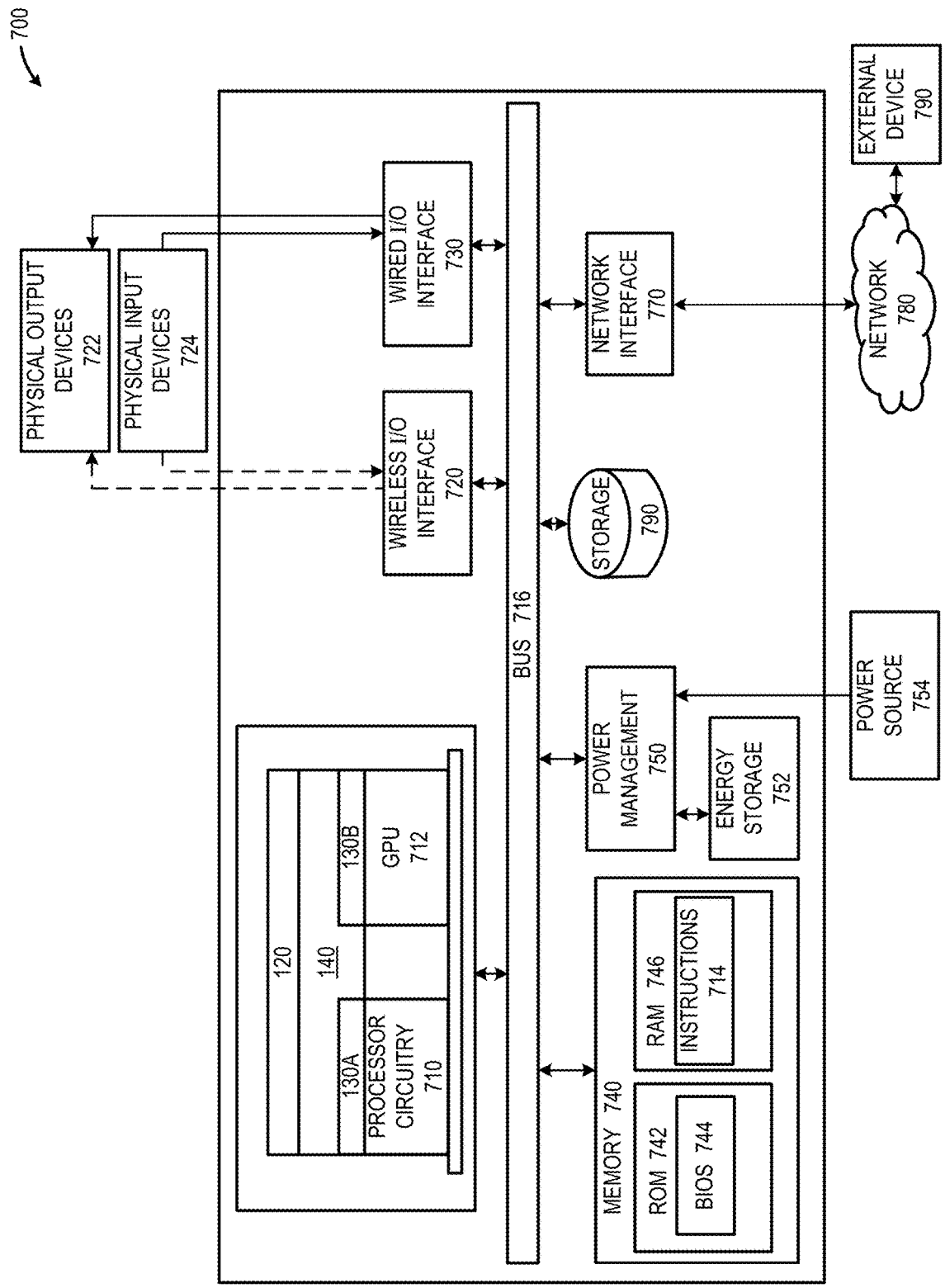
Figure 8A:
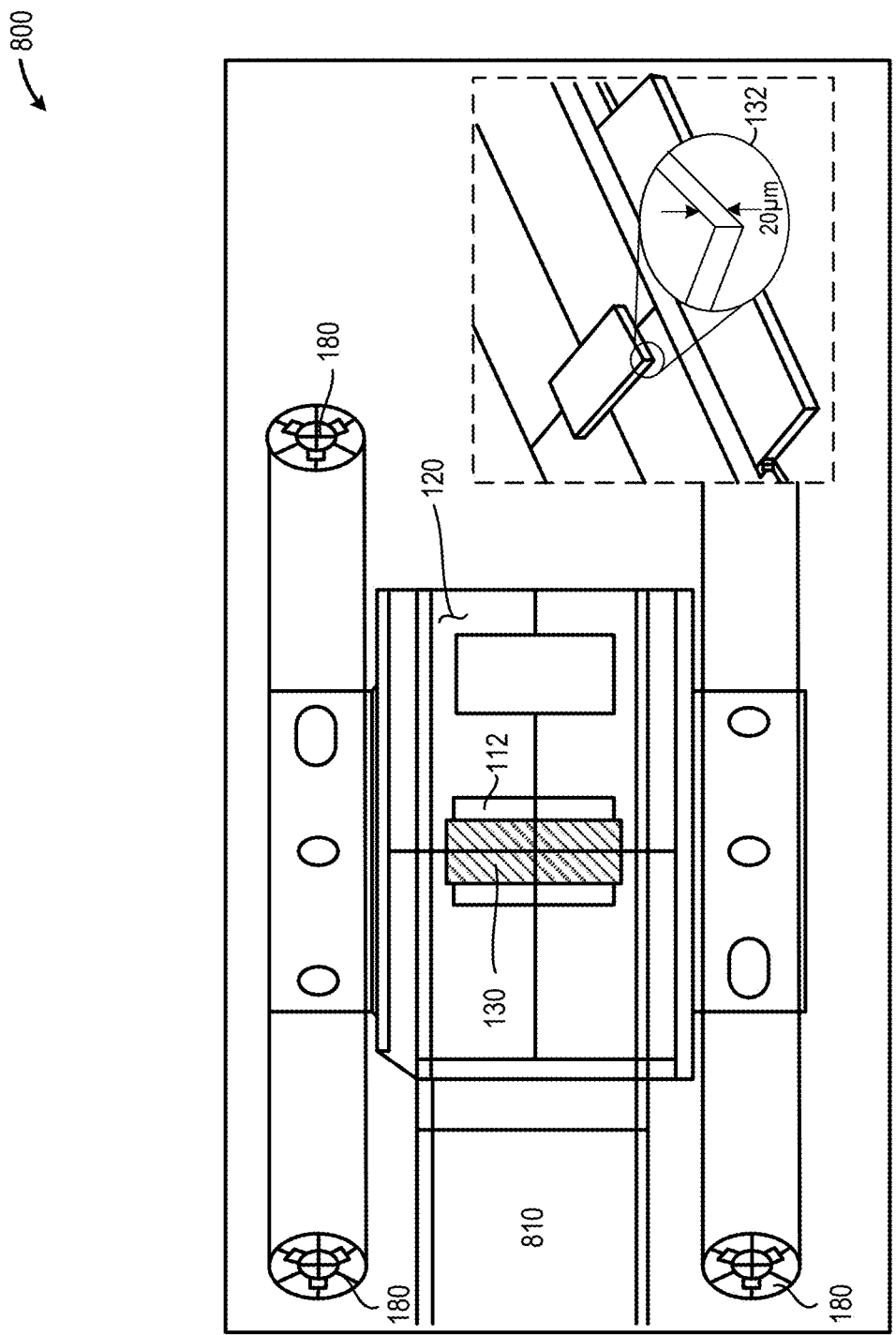
Figure 8B:
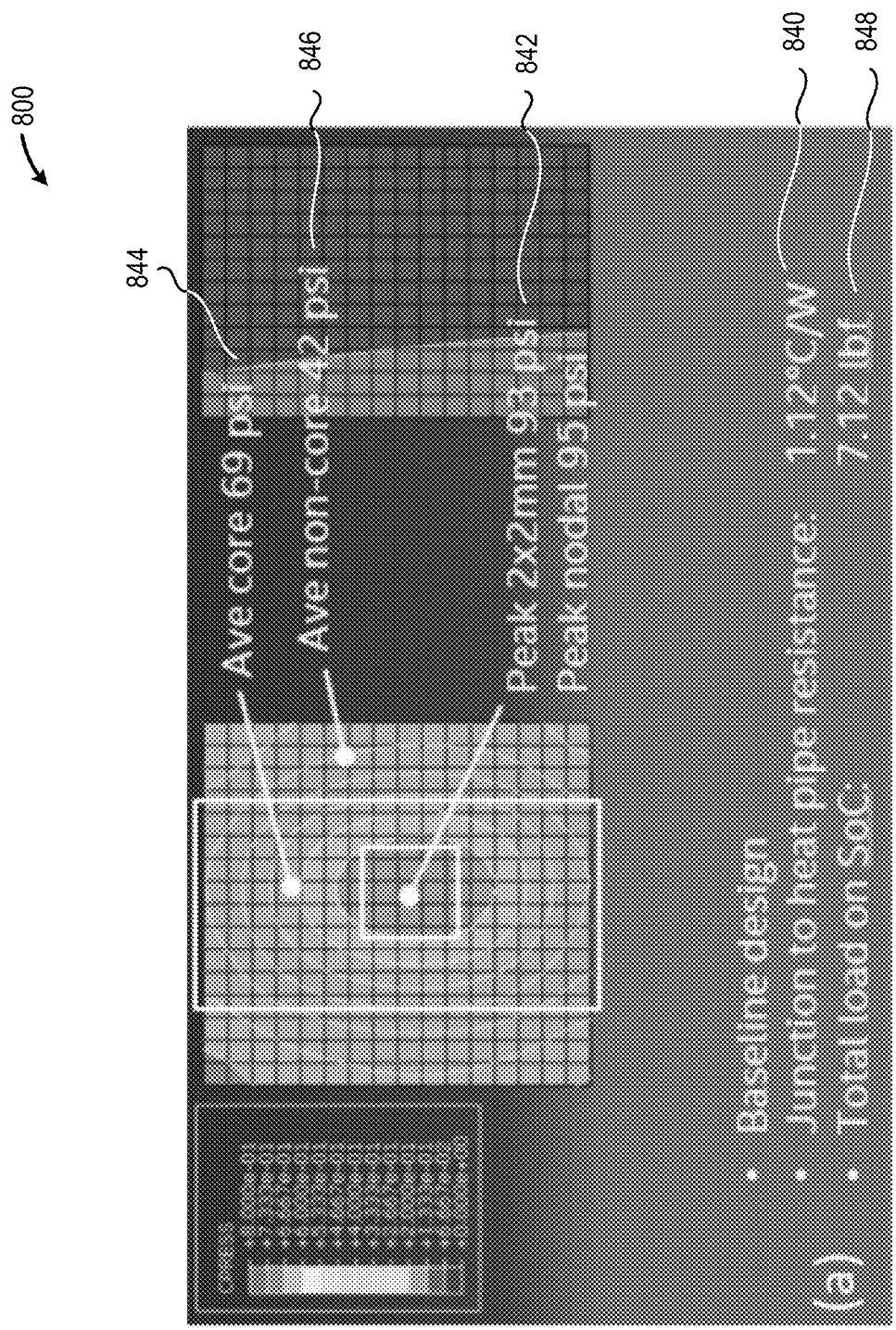
Figure 8C:
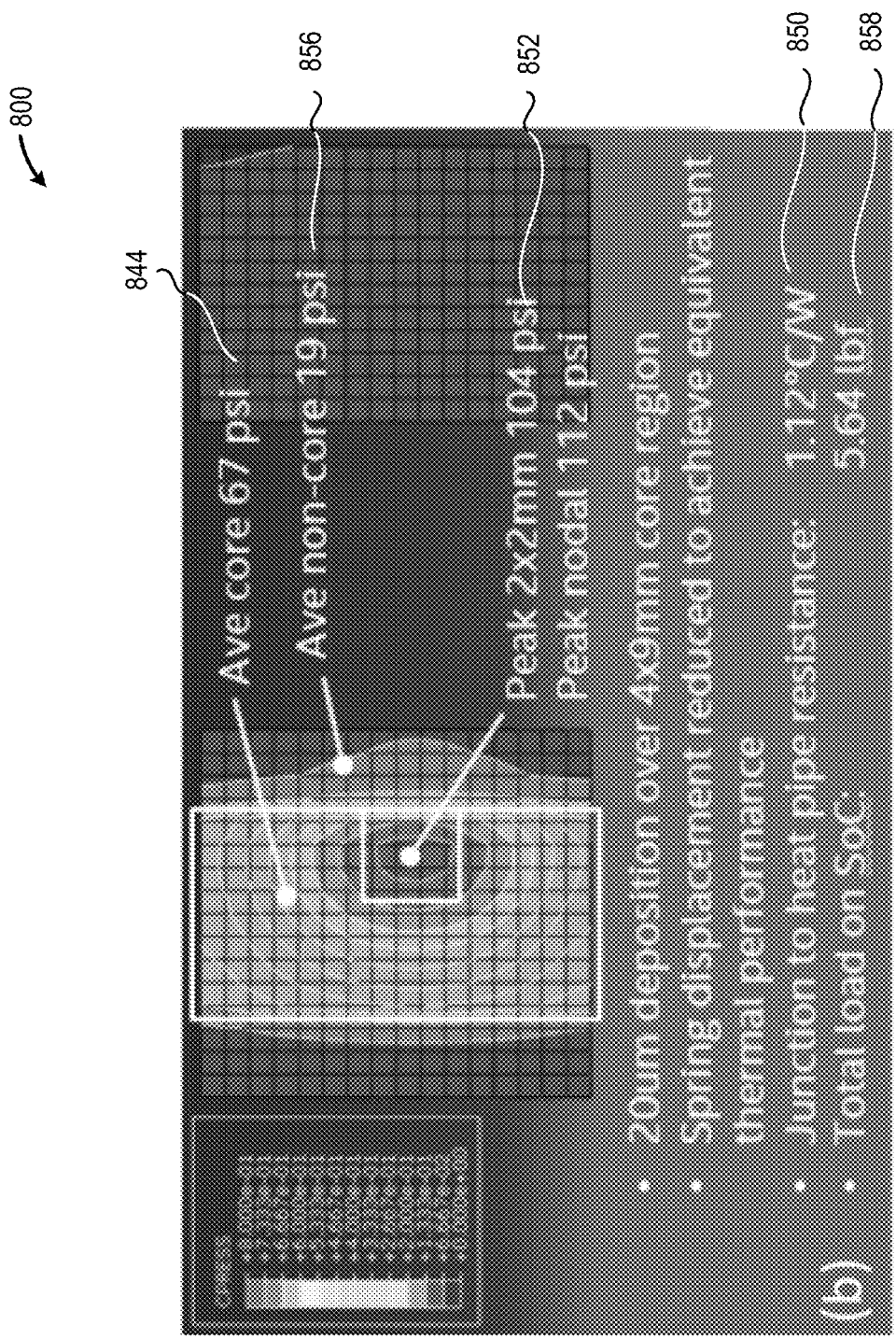
Figure 9:
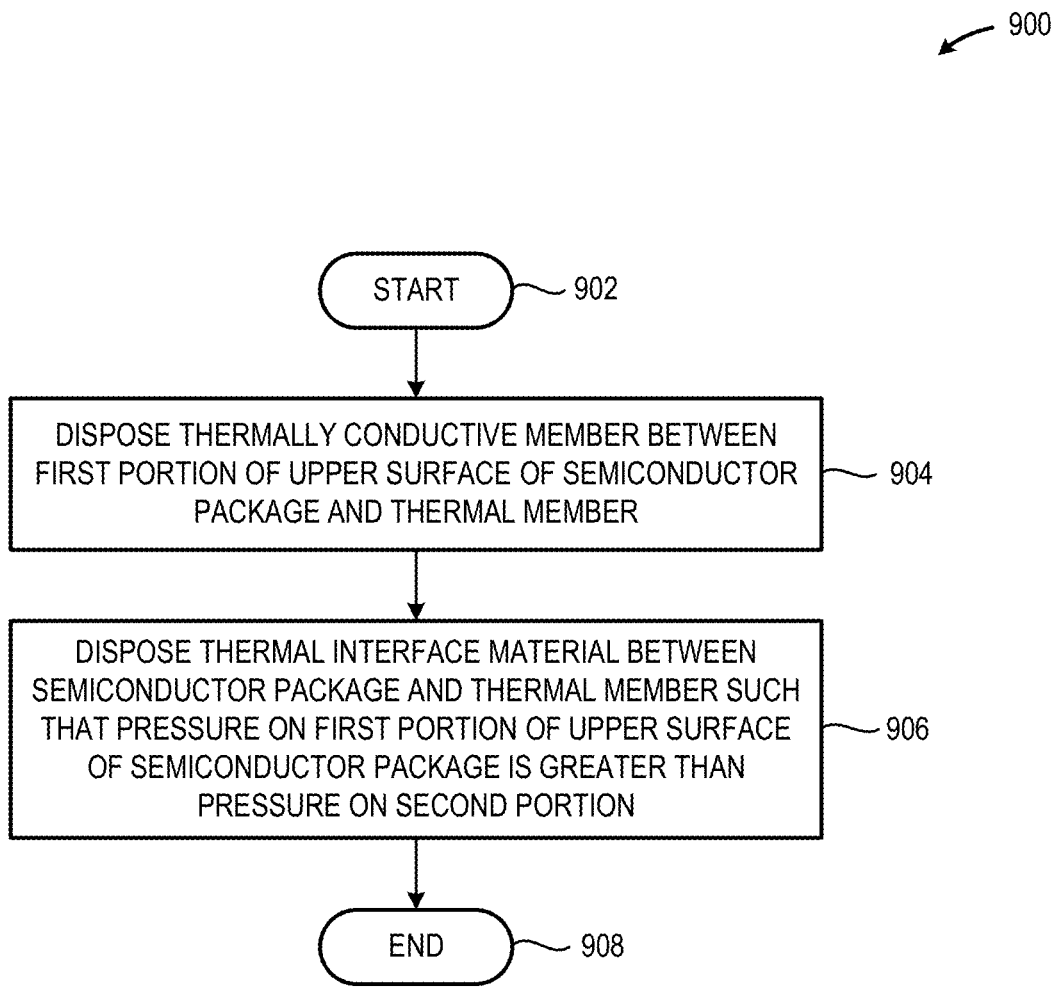

FIG. $1B_1$ provides a vertical cross-sectional elevation of first embodiments of the system depicted in FIG. 1A along sectional line 1B-1B, in accordance with at least one embodiment described herein;

FIG. $1B_2$ provides a vertical cross-sectional elevation of second embodiments of the system depicted in FIG. 1A along sectional line 1B-1B, in accordance with at least one embodiment described herein;

FIG. $1B_3$ provides a vertical cross sectional elevation of third embodiments of the system depicted in FIG. 1A along sectional line 1B-1B, in accordance with at least one embodiment described herein;

FIG. 2 provides a cross-sectional elevation of an illustrative system that includes a ball-grid array (BGA) semiconductor package having a substrate and one or more semiconductor dies disposed on the substrate, a cold plate, and a thermally conductive member disposed on the upper surface of the semiconductor die and projecting into the thermal interface material (TIM) layer, in accordance with at least one embodiment described herein;

FIG. 3 provides a graph depicting the thermal performance enhancement provided by disposal of a thermally conductive member between a SoC semiconductor package and a heat pipe thermal element, in accordance with at least one embodiment described herein;

FIG. 4 provides a bottom perspective view of an illustrative thermal member in which the thermally conductive member has been formed or otherwise deposited on the lower surface of the thermal member, in accordance with at least one embodiment described herein;

FIG. 5 provides an upper perspective view of an illustrative SoC semiconductor package that in which two thermally conductive members have been formed, patterned, deposited, or otherwise disposed proximate respective high thermal output portions of the on the upper surface of the semiconductor package, in accordance with at least one embodiment described herein;

FIG. 6A provides a plan view of an illustrative system that includes thermally conductive member deposited in an off-center high thermal emission portion of the semiconductor package, in accordance with at least one embodiment described herein;

FIG. 6B provides a plan view of an illustrative system that includes a thermally conductive member formed, patterned, deposited, or otherwise disposed on or about a portion of the upper surface of the semiconductor package proximate the location of a processor core within the semiconductor package, in accordance with at least one embodiment described herein;

FIG. 6C provides a plan view of an illustrative system that includes a four thermally conductive members, each of which is formed, patterned, deposited, or otherwise disposed on or about a portion of the upper surface of a multi-core semiconductor package and proximate the location of a respective processor core within the semiconductor package, in accordance with at least one embodiment described herein;

FIG. 6D provides a plan view of an illustrative system that includes a thermally conductive members formed, patterned, deposited, or otherwise disposed on or about a portion of the upper surface of the multi-chip semiconductor package proximate the location of high power chiplets included in the semiconductor package, in accordance with at least one embodiment described herein;

FIG. 7 is a schematic diagram of an illustrative electronic, processor-based, device that includes processor circuitry (CPU) and a graphics processing unit (GPU), each having respective thermally conductive member and thermal interface material (TIM) that thermally couples the CPU and the GPU to a thermal member, in accordance with at least one embodiment described herein;

FIG. 8A provides a plan view of an illustrative system used to compare the thermal performance of a standard system (i.e., no thermally conductive member between the semiconductor package and the thermal member) and the enhanced thermal energy transfer system as disclosed herein (i.e., no thermally conductive member between the semiconductor package and the thermal member), in accordance with at least one embodiment described herein;

FIG. 8B provides a graph showing the pressure exerted on the semiconductor package and the corresponding force exerted on the semiconductor package using the standard system, in accordance with at least one embodiment described herein;

FIG. 8C provides a graph showing the pressure exerted on the semiconductor package and the corresponding force exerted on the semiconductor package using the enhanced thermal energy transfer system, in accordance with at least one embodiment described herein; and FIG. 9 provides a high-level flow diagram of an illustrative method of enhancing the thermal performance of a semiconductor package by disposing a thermally conductive member between the semiconductor package and a thermal member in a first portion of the upper surface of the semiconductor package, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

Thermal interface materials (TIMs) are used to minimize contact resistance and improve conductive heat transfer between the surface of a thermal solution and the surface of a semiconductor die or semiconductor package. The most widely used TIMs exhibit an inverse relationship between applied pressure and thermal resistance—the greater the pressure exerted on the TIM, generally the lesser the thermal resistance, and vice-versa. Decreasing the thermal resistance of the TIM improves the heat transfer from the semiconductor package to the cooling device, improving the performance of the semiconductor package.

However, simply increasing the pressure applied to the TIM increases the pressure applied to the semiconductor package and, consequently, the printed circuit board to which the semiconductor package is mounted. In small form-factor devices, the thickness of printed circuit boards is minimized (typically 0.6 mm or less) to provide the smallest or thinnest possible device profile. The increasing computational demands placed on small form factor portable electronic devices drives the need for high-performance, thermally-challenged SoCs closely mounted on extremely thin printed circuit boards that tend to have greater flex or bending under traditional thermal solution loads resulting in a higher incidence of ball grid array (BGA) solder joint failures. Consequently, solving the thermal challenge by simply applying greater pressure on the TIM and semiconductor package does not work for ultra-thin printed circuit boards. Solving the BGA joint failure by reducing pressure on the TIM and semiconductor package detrimentally compromises the thermal performance of the system and reduces system computational performance.

The systems and methods described herein provide a thermal solution that uses a TIM applied such that different pressures are exerted on the surface of the semiconductor package. The systems and methods described herein provide a relatively high-pressure TIM between the thermal solution and the semiconductor package on portions of the semiconductor package proximate heat generating components and provide a relatively low-pressure TIM on other portions of the semiconductor package that are not proximate the heat generating components. Since the force applied to the semiconductor package and the underlying printed circuit board is the applied pressure times the surface area over which the pressure is applied, by limiting the relatively high pressure TIM to a smaller area, the force applied to the semiconductor package and printed circuit board is beneficially optimized.

The systems and methods described herein use a solid thermally conductive member, of lower compressibility than the adjacent TIM, disposed between the lower surface of the thermal solution and the upper surface of the semiconductor package. The thermally conductive member is positioned between the thermal solution and the semiconductor package in the area where the semiconductor package produces a relatively high thermal output. For example, the thermally conductive member may be disposed above the central processing unit in a SoC. As pressure is applied to the TIM by a thermal solution, such as a cold plate, the TIM pressure exerted on the surface of the semiconductor package in the area proximate the relatively incompressible and/or solid thermal member will be greater than the TIM pressure exerted on the surface of the semiconductor package in other areas.

An enhanced thermal energy transfer system is provided. The system may include: a semiconductor package having an upper surface and a lower surface; wherein, in operation, a first portion of the upper surface of the semiconductor package provides a first thermal output; wherein, in operation, a second portion of the upper surface of the semiconductor package produces a second thermal output, the second thermal output less than the first thermal output; a thermal member having a lower surface spaced apart from the upper surface of the semiconductor package to form an interstitial space between the thermal member and the semiconductor package; a thermally conductive member disposed in the interstitial space, positioned at least partially above at least the first portion of upper surface of the semiconductor package; a thermal interface material (TIM) disposed in the interstitial space between the thermal member and the semiconductor package such that: the TIM disposed between the thermal member and the first portion of the upper surface of the semiconductor package has a first thickness; and the TIM disposed between the thermal member and the second portion of the upper surface of the semiconductor package having a second thickness that is greater than the first thickness.

A semiconductor package thermal control method is provided. The method may include: disposing a thermally conductive member in an interstitial space between an upper surface of a semiconductor package and a lower surface of a thermal member, the thermally conductive member disposed proximate a first portion of the upper surface of the semiconductor package having a first thermal output that is greater than a second thermal output of a second portion of the upper surface of the semiconductor package; and disposing a thermal interface material (TIM) in the interstitial space between the upper surface of the semiconductor package and the lower surface of the thermal member such that a force exerted by the TIM on the first portion of the upper surface of the semiconductor package is greater than a force exerted by the TIM on the second portion of the upper surface of the semiconductor package.

A semiconductor package thermal control system is provided. The system may include: means for disposing a thermally conductive member in an interstitial space between an upper surface of a semiconductor package and a lower surface of a thermal member, the thermally conductive member disposed proximate a first portion of the upper surface of the semiconductor package having a first thermal output that is greater than a second thermal output of a second portion of the upper surface of the semiconductor package; and means for disposing a thermal interface material (TIM) in the interstitial space between the upper surface of the semiconductor package and the lower surface of the thermal member such that a force exerted by the TIM on the first portion of the upper surface of the semiconductor package is greater than a force exerted by the TIM on the second portion of the upper surface of the semiconductor package.

An electronic device is provided. The device may include: a printed circuit board; a semiconductor package coupled to the printed circuit board, the semiconductor package having an upper surface and a lower surface; wherein, in operation, a first portion of the upper surface of the semiconductor package provides a first thermal output; and wherein, in operation, a second portion of the upper surface of the semiconductor package produces a second thermal output, the second thermal output less than the first thermal output; a thermal member having a lower surface spaced apart from the upper surface of the semiconductor package to form an interstitial space between the thermal member and the semiconductor package; a thermally conductive member disposed in the interstitial space, positioned at least partially above at least the first portion of upper surface of the semiconductor package; a thermal interface material (TIM) disposed in the interstitial space between the thermal member and the semiconductor package such that: the TIM disposed between the thermal member and the first portion of the upper surface of the semiconductor package has a first thickness; and the TIM disposed between the thermal member and the second portion of the upper surface of the semiconductor package having a second thickness that is greater than the first thickness; and a housing disposed at least partially about the printed circuit board.

FIG. 1A provides a plan view of an illustrative system 100 that includes a semiconductor die 110 having a thermal member 120 disposed a distance above the upper surface 116 of the semiconductor die 110, a thermally conductive member 130 is disposed between the semiconductor package 110 and the thermal member 120 proximate a portion 112 of the upper surface 116 of the semiconductor package 110 having a relatively high thermal generation when the semiconductor package 110 is operating, in accordance with at least one embodiment described herein. FIG. $1B_1$ provides a vertical cross sectional elevation of first embodiments of the system 100 depicted in FIG. 1A along sectional line 1B-1B, in accordance with at least one embodiment described herein. FIG. $1B_2$ provides a vertical cross sectional elevation of second embodiments of the system 100 depicted in FIG. 1A along sectional line 1B-1B, in accordance with at least one embodiment described herein. FIG. $1B_3$ provides a vertical cross sectional elevation of third embodiments of the system 100 depicted in FIG. 1A along sectional line 1B-1B, in accordance with at least one embodiment described herein.

As depicted in FIGS. 1A and $1B_1$-$1B_3$, the upper surface 116 of the semiconductor package 110 also includes a second portion 114 having a relatively lower thermal generation when the semiconductor package 110 is operating. Also as depicted in FIGS. 1A and $1B_1$-$1B_3$, a thermal interface material (TIM) 140 is disposed in the interstitial space between the upper surface 116 of the semiconductor package 110 and the lower surface 122 of the thermal member 120. The TIM 140 thermally couples the semiconductor package 110 to the thermal member 120, allowing thermal energy released by the semiconductor package 110 to dissipate across a relatively large area provided by the thermal member 120. In some embodiments, the thermally conductive member 130 may be disposed such that the thermally conductive member 130 contacts both the upper surface of the semiconductor package 110 and the lower surface of the thermal member 120.

In operation, the semiconductor package generates and emits thermal energy that is dissipated to reduce the likelihood of damage to the semiconductor package 110 and/or to improve/maintain system 100 performance. The thermal member 120 is formed using one or more thermally conductive materials that more readily and more evenly dissipates thermal energy than the upper surface 116 of the semiconductor package 110. The thermal member 120 is affixed to the printed circuit board, system chassis, or other system components, and tightened to apply a force 150 to the TIM 140 disposed between the thermal member 120 and the semiconductor package 110.

The presence of the thermally conductive member 130 provides two benefits. First, the pressure in the TIM 140 at point 146 between the semiconductor package 110 and the thermal member 120 proximate the thermally conductive member 130 is relatively greater than the pressure in the TIM 140 at point 148 remote from the thermally conductive member 130. The greater pressure exerted on the high thermal energy portion 112 of the semiconductor package 110 beneficially increases the transfer of thermal energy from the upper surface of the semiconductor package 110. This is due to the fact that most widely used TIMs exhibit an inverse relationship between applied pressure and thermal resistance—the greater the pressure exerted on the TIM, generally the lesser the thermal resistance, and vice-versa. Second, the thermal conductivity of the thermally conductive member 130 is typically greater than the thermal conductivity of the TIM 140 surrounding the thermally conductive member 130. Thus, the thermally conductive member tends to dissipate or otherwise disperse the thermal energy more efficiently than the thermal energy can dissipate or otherwise disperse within the TIM 140.

The semiconductor package 110 may include any number and/or combination of semiconductor dies disposed on a semiconductor substrate. In embodiments one or more exposed dies may be disposed on the upper surface 116 of the semiconductor die 110. In embodiments, the semiconductor package 110 may include a system-on-chip (SoC); a field programmable gate array (FPGA); an application specific integrated circuit (ASIC); a multi-chip module (MCM); or similar. The semiconductor package 110 may include one or more ball grid array (BGA) packages, such as: a fine-pitch ball-grid array (FBGA); a low-profile ball-grid array (LBGA); a thermally-enhanced plastic ball-grid array (TEPBGA); a ceramic ball-grid array (CBGA); an organic ball-grid array (OBGA); a thin fine-pitch ball-grid array (TFBGA); a plastic ball-grid array (PBGA); a mold array process—ball-grid array (MAP-BGA); a micro (μ) chip-scale package (UCSP); a micro ball-grid array (μBGA); a low-profile fine-pitch ball-grid array (LFBGA); a thin ball-grid array (TBGA); a super ball-grid array (SBGA); or an ultra-fine ball-grid array (UFBGA).

In operation, the various components (processor, controller, microprocessor, graphics processor, memory controller, memory, etc.) disposed in, on, or about the semiconductor package 110 generate different levels of thermal energy output. The thermal energy output of at least a portion of the components may vary over time, for example as processor intensive operations occur, the processor may generate additional thermal energy. Typically, such thermal energy flows from the semiconductor package into the surrounding environment. In embodiments such as depicted in FIGS. 1A and $1B_1$-$1B_3$, the semiconductor package is thermally coupled to the thermal member 120 via a TIM 140 disposed in at least a portion of the interstitial space between the upper surface 116 of the semiconductor package 110 and the lower surface 122 of the thermal member 120. The thermal member 120 assists in dissipation of thermal energy produced by the semiconductor package 110.

Since different components operate a different temperatures, a first portion 112 of the upper surface 116 of the semiconductor package 110 may operate at a relatively higher temperature than a second portion 114 of the upper surface 116 of the semiconductor package 110. For example, a component disposed beneath the first portion 112 of the upper surface 116 of the semiconductor package 110 may have a thermal output of 130 Watts while a component disposed beneath the second portion 114 of the upper surface 116 of the semiconductor package 110 may have a thermal output of 65 Watts. The presence of the thermally conductive member 130 proximate the first portion 112 of the upper surface 116 beneficially increases the pressure exerted by the TIM 140 on the first portion 112. Increasing the pressure of the TIM on the first portion 112 (at point 146) advantageously increases the flow of thermal energy from the first portion 112 of the upper surface 116 of the semiconductor package 110 without causing a detrimental increase in pressure applied to the second portion 114 (at point 148) of the upper surface 116 of the semiconductor package 110. The lower pressure in the TIM 140 in areas remote from the first portion 112 beneficially reduces the force applied to the semiconductor package 110 and to the printed circuit board to which the semiconductor package 110 is mounted.

The thermal member 120 may include any number and/or combination of materials having a relatively high thermal conductivity capable of dissipating thermal energy produced by the semiconductor package 110 across the surface of the thermal member 120. In embodiments, the area of the upper surface 124 of the thermal member 120 is greater than the area of the upper surface 116 of the semiconductor package 110. The thermal member 120 may be fabricated from one or more metals, such as aluminum or copper. In embodiments, the thermal member 120 includes a cold plate. In embodiments, the thermal member 120 may include one or more fluid tight flow channels formed through all or a portion of the thermal member 120. In such embodiments, a gas (e.g., air) may flow through the flow channels either via convection or via one or more gas movers, such as a fan. In such embodiments, a liquid may flow through the flow channels either via convection or using one or more fluid movers, such as a pump. The thermal member 120 may be fabricated using one or more materials or combination of materials having a thermal conductivity of: greater than 160 Watts per meter-Kelvin (W/m-K): greater than 200 W/m-K; greater than 250 W/m-K; greater than 300 W/m-K; greater than 350 W/m-K; or greater than 400 W/m-K. In embodiments, the thermal member 120 may be physically coupled to the printed circuit board 170 via one or more connectors or connection members 180. Although depicted as a rectangle for clarity, the thermal member 120 can have any size, shape, geometry, and/or physical orientation. The thermal member 120 may have any thickness. In embodiments, the thermal member 120 may have a thickness of: about 0.1 millimeters (mm) or less; about 0.25 mm or less; about 0.5 mm or less; about 0.75 mm or less; about 1 mm or less; about 3 mm or less; or about 5 mm or less. In embodiments, all or a portion of the upper surface 124 of the thermal member 120 may include an extended surface thermal transfer feature (e.g., fins, prongs, or similar).

The thermally conductive member 130 may include any number and/or combination of metallic and/or non-metallic materials, having a lower compressibility than the adjacent TIM 140, having a relatively high thermal conductivity capable of spreading the thermal energy produced by the semiconductor package 110 more or less evenly across the thermally conductive member 130. The thermally conductive member 130 may have any size, shape, geometry, or physical configuration. In embodiments, the thermally conductive member 130 is a planar member arranged parallel to the upper surface 116 of the semiconductor package 110. The presence of the thermally conductive member 130 reduces the thickness 144 of the TIM 140 above the first portion 112 of the upper surface 116 of the semiconductor package 110 when compared to the thickness 142 of the TIM 140 above the remaining portion of the upper surface 116 of the semiconductor package 110. The presence of the thermally conductive member 130 effectively creates a localized region of higher pressure (i.e., the pressure at point 146) in the TIM 140 that, in conjunction with the relatively high thermal conductivity of the thermally conductive member 130 beneficially enhances the thermal energy transfer system in the localized region above the second portion 112 of the upper surface 116 of the semiconductor package 110. By maintaining the TIM 140 at a lower pressure (i.e., the pressure at point 148) across the remaining portion of the upper surface 116 of the semiconductor package 110, the force 150 applied to the semiconductor package 110 and to the printed circuit board 170 remains within limits that do not threaten the integrity of the connections 160 between the semiconductor package 110 and the printed circuit board 170.

The thermally conductive member 130 may be fabricated using one or more materials or combination of materials having a thermal conductivity of: greater than 160 Watts per meter-Kelvin (W/m-K); greater than 200 W/m-K: greater than 250 W/m-K; greater than 300 W/m-K; greater than 350 W/m-K; or greater than 400 W/m-K. The thermally conductive member 130 may be fabricated using one or more metals, for example aluminum and/or copper. The thermally conductive member 130 may be fabricated using one or more non-metals, such as carbon fiber. In embodiments, the thermally conductive member 130 may be fabricated using one or more materials having an in-plane thermal conductivity and a different through-plane thermal conductivity, such as graphene (in plane thermal conductivity=1300-1600 W/m-K; through plane thermal conductivity=13-15 W/m-K). In embodiments, the thermally conductive member 130 may include a generally planar member. In other embodiments, the thermally conductive member 130 may include a curved or parabolic member. In yet other embodiments, the thermally conductive member 130 may include a solid or hollow hemispherical member.

The thermally conductive member 130 may have any thickness 132. In the depicted embodiment with a rectangular thermally conductive member 130, the thermally conductive member 130 may have a length of from about 0.1 mm to about 40 mm and a width of from about 0.1 mm to about 40 mm. In embodiments, the thermally conductive member 130 may have a thickness 132 of: about 100 micrometers (µm) or less; about 75 µm or less; about 50 µm or less; about 401 µm or less; about 30 µm or less; about 20 µm or less; about 10 µm or less. In the region above the first portion 112 of the upper surface 116 of the semiconductor package 110 occupied by the thermally conductive member 130, the thickness 144 of the TIM 140 is less than the thickness 142 of the TIM 140 across the remaining portion of the upper surface 116 of the semiconductor package 110.

As depicted in FIG. 1B$_1$, in some embodiments, the thermally conductive member 130 may be disposed at an intermediate point in the TIM 140, distal from the upper surface 116 of the semiconductor package 110 and distal from the lower surface 122 of the thermal member 120. In such embodiments, the thermally conductive member 130 may be disposed generally parallel to the upper surface 116 of the semiconductor package 110 and/or the lower surface 122 of the thermal member 120. In embodiments the distance between the thermally conductive member 130 and the lower surface 122 of the thermal member 120 may be the same as or different from the distance between the thermally conductive member 130 and the upper surface 116 of the semiconductor package 110.

As depicted in FIG. $1B_2$, in other embodiments, the thermally conductive member 130 may be disposed proximate the upper surface 116 of the semiconductor package 110 and distal from the lower surface 122 of the thermal member 120. In embodiments, the thermally conductive member 130 may be formed, patterned, deposited, or otherwise disposed on or about the first portion 112 of the upper surface 116 of the semiconductor package 110. For example, the thermally conductive member 130 may be a metallic member that is deposited or formed via photolithography on the upper surface 116 of the semiconductor package 110. In other embodiments, the thermally conductive member 130 may be separately formed and bonded or otherwise affixed to the upper surface 116 of the semiconductor package 110.

As depicted in FIG. $1B_3$, in yet other embodiments, the thermally conductive member 130 may be disposed distal from the upper surface 116 of the semiconductor package 110 and proximate the lower surface 122 of the thermal member 120. In embodiments, the thermally conductive member 130 may be formed, patterned, deposited, etched, or otherwise disposed on or about the lower surface 122 of the thermal member 120 in the area occupied by the first portion 112 of the semiconductor package 110. For example, the thermally conductive member 130 may be a metallic member that is formed via chemical or mechanical etching or grinding on the lower surface 122 of the thermal member 120. In other embodiments, the thermally conductive member 130 may be separately formed and bonded or otherwise affixed to the lower surface 122 of the thermal member 120.

The thermal interface material (TIM) 140 may include any material or substance capable of thermally coupling the semiconductor package 110 to the thermal member 120. In embodiments, the TIM 140 may include a plurality of thermally conductive structures (nanostructures, particles, ribbons, etc.) suspended in a flowable matrix. In other embodiments, the TIM 140 may include a compressible material such as a thermally conductive tape or thermally conductive elastomeric material. The TIM 140 may have a thickness 142 in areas other than the first portion 112 of the upper surface 116 of: less than about 500 micrometers (μm); less than about 400 μm; less than about 300 μm; less than about 250 Nm; less than about 200 μm; less than about 160 μm; less than about 100 μm; less than about 75 μm; or less than about 50 μm. The TIM may include any number and/or combination of materials capable of thermally bonding the semiconductor package 110 to the thermal member 120 and having a thermal conductivity of: greater than 0.5 Watts per meter-Kelvin (W/m-K); greater than 1 W/m-K; greater than 2 W/m-K; greater than 5 W/m-K: greater than 7 W/m-K; or greater than 10 W/m-K. In embodiments, a localized region of relatively high pressure (i.e., the pressure at point 146) may be exerted by the TIM on the first portion 112 of the upper surface 116 of the semiconductor package 110 while the TIM 140 proximate the remaining portion of the upper surface 116 of the semiconductor package 110 is at e relatively lower pressure (i.e., the pressure at point 148).

FIG. 2 provides a cross-sectional elevation of an illustrative system 200 that includes a ball-grid array (BGA) semiconductor package 110 having a substrate 210 and one or more semiconductor dies 220 disposed on the substrate 210, a cold plate 120, and a thermally conductive member 130 disposed on the upper surface of the semiconductor die 220 and projecting into the thermal interface material (TIM) layer 140, in accordance with at least one embodiment described herein. As depicted in FIG. 2, although exaggerated, the force 150 applied to the semiconductor package 110 by the thermal member 120 can case distortion and/or warping of the printed circuit board 170. Combining the distortion of the printed circuit board 170 with the thermal cycling experienced by the semiconductor package 110 and (potentially) rough handling of the electronic device in which the semiconductor package 110 is installed, significant forces can be placed on the ball-grid array 160. At times, such forces may cause all or a portion of the solder balls forming the ball-grid array to crack or fracture, compromising the operability of the electronic device.

As depicted in FIG. 2, the semiconductor package 110 may include a semiconductor substrate 210 having any number, combination, and/or type of semiconductor die 220 disposed in, on, about, or across all or a portion of the surface of the semiconductor substrate 210. The semiconductor die 220 emits thermal energy when in operation. This release of thermal energy causes relatively high thermal emission in the first portion 112 of the semiconductor package 110. The presence of the thermally conductive member 130 proximate the first portion 112 of the upper surface 116 of the semiconductor package 110 forms a relatively higher pressure region 230 in the TIM 140. Thermal energy is more readily transferred through this relatively higher pressure region 230 than in other relatively lower pressure regions of the TIM 140. This region of enhanced thermal energy transfer beneficially assists in maintaining the operating temperature of the first portion 112 of the upper surface 116 of the semiconductor package 110 in a desired range.

FIG. 3 provides a graph 300 depicting the thermal performance enhancement provided by disposal of a thermally conductive member 130 between a SoC semiconductor package 110 and a heat pipe thermal element 120, in accordance with at least one embodiment described herein. The graph 300 plots heat resistance 310 against applied force 320 for three separate cases: a baseline case without the thermally conductive member 130 (line 330); a first test case with a 4 mm×9 mm, 20 μm thick thermally conductive member 130 (line 350); and a second test case with a 4 mm×9 mm, 40 μm this thermally conductive member 150. As shown in FIG. 3, to achieve the same thermal resistance value 380 (approx. 1.12° C./watt) requires an applied force of about 7.1 pounds force ($lb_f$) in the absence of a thermally conductive member 130; about 5.6 $lb_f$ using the 20 μm thermally conductive member (a 21% reduction in applied force); and about 4.6 $lb_f$ using the 40 μm thermally conductive member (a 35% reduction in applied force).

FIG. 4 provides a bottom perspective view of an illustrative thermal member 120 in which the thermally conductive member 130 has been formed or otherwise deposited on the lower surface of the thermal member 120, in accordance with at least one embodiment described herein. As depicted in FIG. 4, in embodiments, the thermally conductive member 130 may be formed on the bottom surface 122 of the thermal member 120, for example by subtractive etching. In such embodiments, material may be removed using any currently available or future developed material removal process or method. For example, material may be selectively removed from the bottom surface 122 of the thermal member 120 via chemical etching, mechanical abrasion, electrolysis, or photolithography. In other embodiments, the thermally conductive member 130 may be separately fabricated and affixed or otherwise bonded to the lower surface 122 of the thermal member 120, for example via welding, thermally cured adhesives, or chemically cured adhesives.

FIG. 5 provides an upper perspective view of an illustrative SoC semiconductor package 110 that in which two thermally conductive members 130A and 130B have been formed, patterned, deposited, or otherwise disposed proximate respective high thermal output portions 112A, 112B of the on the upper surface 116 of the semiconductor package 110, in accordance with at least one embodiment described herein. As depicted in FIG. 5, in embodiments, the thermally conductive members 130A. 130B may be formed on at least a portion of the upper surface 116 of the semiconductor package 110. The thermally conductive members 130A. 130B may be formed using any currently available or future developed material deposition process or method. For example, the thermally conductive members 130A, 130B may be deposited on the upper surface of the semiconductor package 110 via photolithography or electrodeposition. In other embodiments, the thermally conductive members 130A, 130B may be separately fabricated and affixed or otherwise bonded to the upper surface 116 of the semiconductor package 110, for example via welding, thermally cured adhesives, or chemically cured adhesives.

FIG. 6A provides a plan view of an illustrative system 600A that includes thermally conductive member 130 deposited in an off-center high thermal emission portion of the semiconductor package 110, in accordance with at least one embodiment described herein. As depicted in FIG. 6A, the thermally conductive member 130 may advantageously be deposited proximate any portion of the upper surface 116 of the semiconductor package 110 demonstrating a high thermal emission rate. For example, the thermally conductive member 130 may be deposited off-center and proximate a portion of a multi-chip semiconductor package 110 containing one or more high thermal emission semiconductor dies, such as a CPU die, a GPU die, an off-center CPU die, dies having differing heights and similar.

FIG. 6B provides a plan view of an illustrative system 600B that includes a thermally conductive member 130 formed, patterned, deposited, or otherwise disposed on or about a portion of the upper surface 116 of the semiconductor package 110 proximate the location of a processor core or a group of processor cores within the semiconductor package 110, in accordance with at least one embodiment described herein.

FIG. 6C provides a plan view of an illustrative system 600C that includes a four thermally conductive members 130A-130D, each of which is formed, patterned, deposited, or otherwise disposed on or about a portion of the upper surface 116 of a multi-core semiconductor package 110 and proximate the location of a respective processor core within the semiconductor package 110, in accordance with at least one embodiment described herein.

FIG. 6D provides a plan view of an illustrative system 600D that includes a thermally conductive members 130A-130C formed, patterned, deposited, or otherwise disposed on or about a portion of the upper surface 116 of the multi-chip semiconductor package 110 proximate the location of high power chiplets included in the semiconductor package 110, in accordance with at least one embodiment described herein.

FIG. 7 is a schematic diagram of an illustrative electronic, processor-based, device 700 that includes processor circuitry (CPU) 710 and a graphics processing unit (GPU) 712, each having respective thermally conductive member 130A, 130B and thermal interface material (TIM) 140 that thermally couples the CPU 710 and the GPU 712 to a thermal member 120, in accordance with at least one embodiment described herein. The processor-based device 700 may additionally include one or more of the following: a wireless input/output (I/O) interface 720, a wired I/O interface 730, system memory 180, power management circuitry 750, a non-transitory storage device 170, and a network interface 770. The following discussion provides a brief, general description of the components forming the illustrative processor-based device 700. Example, non-limiting processor-based devices 700 may include, but are not limited to: smartphones, wearable computers, portable computing devices, handheld computing devices, desktop computing devices, blade server devices, workstations, and similar.

The processor-based device 700 includes graphics processor circuitry 712 capable of executing machine-readable instruction sets 714 and generating an output signal capable of providing a display output to a system user. Those skilled in the relevant art will appreciate that the illustrated embodiments as well as other embodiments may be practiced with other processor-based device configurations, including portable electronic or handheld electronic devices, for instance smartphones, portable computers, wearable computers, consumer electronics, personal computers ("PCs"), network PCs, minicomputers, server blades, mainframe computers, and the like. The CPU 710 and the GPU 712 may include any number of hardwired or configurable circuits, some or all of which may include programmable and/or configurable combinations of electronic components, semiconductor devices, and/or logic elements that are disposed partially or wholly in a PC, server, or other computing system capable of executing processor-readable instructions.

The processor-based device 700 includes a bus or similar communications link 716 that communicably couples and facilitates the exchange of information and/or data between various system components including the CPU 710, the GPU 712, one or more wireless I/O interfaces 720, one or more wired I/O interfaces 730, the system memory 740, one or more network interfaces 770, and/or one or more storage devices 760. The processor-based device 700 may be referred to in the singular herein, but this is not intended to limit the embodiments to a single processor-based device 700, since in certain embodiments, there may be more than one processor-based device 700 that incorporates, includes, or contains any number of communicably coupled, collocated, or remote networked circuits or devices.

The CPU 710 may include any number, type, or combination of currently available or future developed devices capable of executing machine-readable instruction sets. The CPU 710 may include but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), programmable logic units, field programmable gate arrays (FPGAs), and the like. Unless described otherwise, the construction and operation of the various blocks shown in FIG. 7 are of conventional design. Consequently, such blocks need not be described in further detail herein, as they will be understood by those skilled in the relevant art. The bus 716 that interconnects at least some of the components of the processor-based device 700 may employ any currently available or future developed serial or parallel bus structures or architectures.

The system memory 740 may include read-only memory ("ROM") 742 and random access memory ("RAM") 746. A portion of the ROM 742 may be used to store or otherwise retain a basic input/output system ("BIOS") 744. The BIOS 744 provides basic functionality to the processor-based device 700, for example by causing CPU 710 and/or GPU 712 to load and/or execute one or more machine-readable instruction sets 714. In embodiments, at least some of the one or more machine-readable instruction sets 714 cause at least a portion of the CPU 710 and/or GPU 712 to provide, create, produce, transition, and/or function as a dedicated, specific, and particular machine, for example a word processing machine, a digital image acquisition machine, a media playing machine, a gaming system, a communications device, a smartphone, or similar.

The processor-based device 700 may include at least one wireless input/output (I/O) interface 720. The at least one wireless I/O interface 720 may be communicably coupled to one or more physical output devices 722 (tactile devices, video displays, audio output devices, hardcopy output devices, etc.). The at least one wireless I/O interface 720 may communicably couple to one or more physical input devices 724 (pointing devices, touchscreens, keyboards, tactile devices, etc.). The at least one wireless I/O interface 720 may include any currently available or future developed wireless I/O interface. Example wireless I/O interfaces include, but are not limited to: BLUETOOTH®, near field communication (NFC), and similar.

The processor-based device 700 may include one or more wired input/output (I/O) interfaces 730. The at least one wired I/O interface 730 may be communicably coupled to one or more physical output devices 722 (tactile devices, video displays, audio output devices, hardcopy output devices, etc.). The at least one wired I/O interface 730 may be communicably coupled to one or more physical input devices 724 (pointing devices, touchscreens, keyboards, tactile devices, etc.). The wired I/O interface 730 may include any currently available or future developed I/O interface. Example wired I/O interfaces include, but are not limited to: universal serial bus (USB), IEEE 1394 ("FireWire"), and similar.

The processor-based device 700 may include one or more communicably coupled, non-transitory, data storage devices 760. The data storage devices 760 may include one or more hard disk drives (HDDs) and/or one or more solid-state storage devices (SSDs). The one or more data storage devices 760 may include any current or future developed storage appliances, network storage devices, and/or systems. Non-limiting examples of such data storage devices 760 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the one or more data storage devices 760 may include one or more removable storage devices, such as one or more flash drives, flash memories, flash storage units, or similar appliances or devices capable of communicable coupling to and decoupling from the processor-based device 700.

The one or more data storage devices 760 may include interfaces or controllers (not shown) communicatively coupling the respective storage device or system to the bus 716. The one or more data storage devices 760 may store, retain, or otherwise contain machine-readable instruction sets, data structures, program modules, data stores, databases, logical structures, and/or other data useful to the CPU 710 and/or GPU 712 and/or one or more applications executed on or by the CPU 710 and/or GPU 712. In some instances, one or more data storage devices 170 may be communicably coupled to the CPU 720, for example via the bus 716 or via one or more wired communications interfaces 730 (e.g., Universal Serial Bus or USB); one or more wireless communications interfaces 720 (e.g., Bluetooth®, Near Field Communication or NFC); and/or one or more network interfaces 770 (IEEE 802.3 or Ethernet, IEEE 802.11, or WiFi®, etc.).

Processor-readable instruction sets 714 and other programs, applications, logic sets, and/or modules may be stored in whole or in part in the system memory 740. Such instruction sets 714 may be transferred, in whole or in part, from the one or more data storage devices 760. The instruction sets 714 may be loaded, stored, or otherwise retained in system memory 740, in whole or in part, during execution by the CPU 710 and/or GPU 712.

The processor-based device 700 may include power management circuitry 750 that controls one or more operational aspects of the energy storage device 752. In embodiments, the energy storage device 752 may include one or more primary (i.e., non-rechargeable) or secondary (i.e., rechargeable) batteries or similar energy storage devices. In embodiments, the energy storage device 752 may include one or more supercapacitors or ultracapacitors. In embodiments, the power management circuitry 750 may alter, adjust, or control the flow of energy from an external power source 754 to the energy storage device 752 and/or to the processor-based device 700. The power source 754 may include, but is not limited to, a solar power system, a commercial electric grid, a portable generator, an external energy storage device, or any combination thereof.

For convenience, the CPU 710, the GPU 712, the wireless I/O interface 720, the wired I/O interface 730, the system memory 740, the power management circuitry 750, the storage device 760, and the network interface 770 are illustrated as communicatively coupled to each other via the bus 716, thereby providing connectivity between the above-described components. In alternative embodiments, the above-described components may be communicatively coupled in a different manner than illustrated in FIG. 7. For example, one or more of the above-described components may be directly coupled to other components, or may be coupled to each other, via one or more intermediary components (not shown). In another example, one or more of the above-described components may be integrated into CPU 710, and/or the GPU 712. In some embodiments, all or a portion of the bus 716 may be omitted and the components are coupled directly to each other using suitable wired or wireless connections.

FIG. 8A provides a plan view of an illustrative system 800 used to compare the thermal performance of a standard system (i.e., no thermally conductive member between the semiconductor package and the thermal member) and the enhanced thermal energy transfer system as disclosed herein (i.e., no thermally conductive member between the semiconductor package and the thermal member), in accordance with at least one embodiment described herein. FIG. 8B provides a graph showing the pressure exerted on the semiconductor package 110 and the corresponding force exerted on the semiconductor package 110 using the standard system, in accordance with at least one embodiment described herein. FIG. 8C provides a graph showing the pressure exerted on the semiconductor package 110 and the corresponding force exerted on the semiconductor package 110 using the enhanced thermal energy transfer system, in accordance with at least one embodiment described herein.

As depicted in FIG. 8A, in embodiments, the thermal member 120 may include a structure 810 to which a cold plate 820 is attached. A thermally conductive member 130 having a thickness 132 of about 20 μm is disposed proximate or formed with the lower surface of the cold plate and a heat pipe 830 is thermally coupled to the cold plate 820. This structure forms the thermal member 120 used to prepare the data presented in FIG. 8C. A similar system, without the thermally conductive member 130 was used to prepare the data presented in FIG. 8B.

Referring first to FIG. 8B, using the conventional thermal energy transfer system as a baseline, the thermal resistance (junction to heat pipe) 840 was set to 1.12° C./watt. To achieve the thermal resistance 840, the overall force 848 applied to the semiconductor package 110 was 7.12 lb$_f$. At an applied force 848 of 7.12 lb$_f$, a peak pressure of 93 psi was observed, an average core pressure of 69 psi was observed and an average non-core pressure of 42 psi was observed. Note the relatively small difference in core v. non-core pressure—approximately 27 psi.

Referring next to FIG. 8C, using the enhanced thermal energy transfer system as disclosed herein, the thermal resistance (junction to heat pipe) 850 was again set to 1.12° C./watt. To achieve the thermal resistance 850 of 1.12° C./W, required an overall force 858 of 5.64 lb$_f$ be applied to the semiconductor package 110—a 21% reduction in force over the baseline case depicted in FIG. 8B. At an applied force 858 of 5.64 lb$_f$, a peak pressure of 104 psi was observed (a 12% increase in pressure), an average core pressure of 67 psi was observed and an average non-core pressure of 19 psi was observed. Note the relatively large difference in average core v. average non-core pressure—approximately 48 psi.

FIG. 9 provides a high-level flow diagram of an illustrative method 900 of enhancing the thermal performance of a semiconductor package 110 by disposing a thermally conductive member 130 between the semiconductor package 110 and a thermal member 120 in a first portion 112 of the upper surface 116 of the semiconductor package 110, in accordance with at least one embodiment described herein. The thermally conductive member 130 is disposed in the interstitial space formed between the upper surface 116 of the semiconductor package 110 and the lower surface 122 of the thermal member 120. A thermal interface material (TIM) 140 is disposed proximate the thermally conductive member 130 and between the upper surface 116 of the semiconductor package 110 and the lower surface 122 of the thermal member 120. A force 150 applied to the thermal member 120, for example by tightening the coupling of the thermal member 120 to the printed circuit board 160, increases the pressure exerted by the TIM 140 on the upper surface 116 of the semiconductor package 110. The presence of the relatively incompressible and/or solid thermally conductive member 130 creates a relatively higher pressure region within the TIM 140 above and/or below the thermally conductive member 130 when compared to the relatively lower pressure across a second portion of the upper surface 116 of the semiconductor package 110 that is remote from the thermally conductive member 130. The method 900 commences at 902.

At 904, the thermally conductive member 130 is disposed in the interstitial space between the semiconductor package 110 and the thermal member 120. The thermally conductive member 130 is positioned, patterned, formed, deposited, or otherwise disposed in a location above a first portion 112 of the upper surface 116 of the sap 110 having a relatively high thermal emission when the semiconductor package 110 is in an operating state.

In some embodiments, the thermally conductive member 130 is formed integral with the lower surface 122 of the thermal member 120. For example, a portion of the lower surface 122 of the thermal member 120 may be chemically or mechanically removed such that the thermally conductive member 130 projects from the lower surface 122. In another embodiment, the thermally conductive member 130 may be electrodeposited on the lower surface 122 of the thermal member 120. In yet other embodiments, the thermally conductive member 130 may be separately fabricated and bonded or otherwise affixed to the lower surface 122 of the thermal member 120, for example by welding, thermally cured adhesive, or chemically cured adhesive.

In some embodiments, the thermally conductive member 130 is positioned, patterned, formed, deposited, or otherwise disposed proximate the first portion 112 of the upper surface 116 of the semiconductor package 110. For example, the thermally conductive member 130 may be photolithographed onto the upper surface 116 of the semiconductor package 110 and/or a semiconductor die 210 on the surface of the semiconductor package 110.

In embodiments, the thermally conductive member 130 may be disposed a first distance from the upper surface 116 of the semiconductor package 110 and a second distance from the lower surface 122 of the thermal member 120. In some embodiments, the first distance and the second distance may be approximately equal. In other embodiments, the first distance and the second distance may be different and the thermally conductive member 130 may be biased towards the either the thermal member 120 or the semiconductor package 110.

At 906, the TIM 140 is disposed in the interstitial space between the semiconductor package 110 and the thermal member 120. In embodiments, the TIM 140 may include a flowable material that is thermally, chemically, or electromagnetically cured once positioned between the semiconductor package 110 and the thermal member 120. In embodiments, prior to fully curing the TIM 140, a force 150 is applied to the thermal member 120, for example by tightening the physical connection or physical coupling of the thermal member 120 to the printed circuit board 160. The pressure exerted on the first portion 112 of the upper surface 116 of the semiconductor package 110 is relatively higher or greater than the pressure exerted on a second portion 114 of the upper surface 116 that is remote from the first portion 112. The increased pressure exerted on the first portion 112 of the upper surface 116 of the semiconductor package 110 beneficially increases the flow of thermal energy from the first portion 112 to the thermal member 120. The method 900 concludes at 908.

While FIG. 9 illustrates various operations according to one or more embodiments, it is to be understood that not all of the operations depicted in FIG. 9 are necessary for other embodiments. Indeed, it is fully contemplated herein that in other embodiments of the present disclosure, the operations depicted in FIG. 9, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., non-volatile) in memory devices.

As used in any embodiment herein, the term "circuitry" may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to enhanced thermal energy transfer systems for semiconductor packages. A thermally conductive member is disposed in the interstitial space between an upper surface of a semiconductor package and a lower surface of a thermal member. The thermally conductive member is disposed above a first portion of the upper surface of the semiconductor package having a relatively higher thermal energy output when the semiconductor package is operating. A thermal interface material (TIM) is disposed in the interstitial space and a force applied to the thermal member. The thermally conductive member forms a relatively higher pressure region above the first portion of the semiconductor package and a relatively lower pressure region in other portions of the semiconductor package remote from the thermally conductive member. The increased pressure region proximate the thermally conductive member beneficially enhances the flow of thermal energy from the first portion of the semiconductor package to the thermal member.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for maintaining consistency between a system architectural state and a microarchitectural state in the system cache circuitry to prevent a side-channel attack from accessing secret information stored in the cache circuitry based on the speculative execution of an instruction by processor circuitry.

According to example 1, there is provided an enhanced thermal energy transfer system. The system may include: a semiconductor package having an upper surface and a lower surface; wherein, in operation, a first portion of the upper surface of the semiconductor package provides a first thermal output; wherein, in operation, a second portion of the upper surface of the semiconductor package produces a second thermal output, the second thermal output less than the first thermal output; a thermal member having a lower surface spaced apart from the upper surface of the semiconductor package to form an interstitial space between the thermal member and the semiconductor package; a thermally conductive member disposed in the interstitial space, proximate at least the first portion of upper surface of the semiconductor package; a thermal interface material (TIM) disposed in the interstitial space between the thermal member and the semiconductor package such that: the TIM disposed between the thermal member and the first portion of the upper surface of the semiconductor package has a first thickness; and the TIM disposed between the thermal member and the second portion of the upper surface of the semiconductor package having a second thickness that is greater than the first thickness.

Example 2 may include elements of example 1 where at least a portion of the thermally conductive member comprises a thermally conductive member disposed proximate the lower surface of the thermal member.

Example 3 may include elements of any of examples 1 or 2 where at least a portion of the thermally conductive member comprises a thermally conductive member formed integral with and projecting from the lower surface of the thermal member.

Example 4 may include elements of any of examples 1 through 3 where at least a portion of the thermally conductive member comprises a thermally conductive member disposed proximate the upper surface of the semiconductor package.

Example 5 may include elements of any of examples 1 through 4 where the thermally conductive member comprises one or more materials having a thermal conductivity equal to or greater than the thermal conductivity of the thermal member.

Example 6 may include elements of any of examples 1 through 5 where the thermally conductive member comprises one or more materials having a thermal conductivity equal to or greater than the thermal interface material.

Example 7 may include elements of any of examples 1 through 6 where the thermal conductivity of the thermal member and the first thickness of TIM is greater than the thermal conductivity of the second thickness of TIM.

Example 8 may include elements of any of examples 1 through 7 where a first pressure exerted on the first portion of the upper surface of the semiconductor package is greater than a second pressure exerted on the second portion of upper surface of the semiconductor package.

Example 9 may include elements of any of examples 1 through 8 where the TIM comprises a slurry of particles having a relatively high thermal conductivity disposed in a relatively low thermal conductivity carrier material.

Example 10 may include elements of any of examples 1 through 9 where the thermally conductive member comprises at least one of: a copper-containing member or an aluminum-containing member.

Example 11 may include elements of any of examples 1 through 10 where the thermally conductive member comprises a member having a thickness of from about 10 micrometers (μm) to about 50 μm.

Example 12 may include elements of any of examples 1 through 11 where the first portion of the upper surface of the semiconductor package comprises a portion of the upper surface of the semiconductor package proximate a central processing unit (CPU) semiconductor die.

Example 13 may include elements of any of examples 1 through 12 where the thermal member comprises a cold plate.

According to example 14, there is provided a semiconductor package thermal control method. The method may include: disposing a thermally conductive member in an interstitial space between an upper surface of a semiconductor package and a lower surface of a thermal member, the thermally conductive member disposed proximate a first portion of the upper surface of the semiconductor package having a first thermal output that is greater than a second thermal output of a second portion of the upper surface of the semiconductor package; and disposing a thermal interface material (TIM) in the interstitial space between the upper surface of the semiconductor package and the lower surface of the thermal member such that a force exerted by the TIM on the first portion of the upper surface of the semiconductor package is greater than a force exerted by the TIM on the second portion of the upper surface of the semiconductor package.

Example 15 may include elements of example 14 where disposing the thermally conductive member in the interstitial space between the upper surface of the semiconductor package and the lower surface of the thermal member may include: disposing the thermally conductive member in the interstitial space between the upper surface of the semiconductor package and the lower surface of the thermal member and proximate the lower surface of the thermal member.

Example 16 may include elements of any of examples 14 or 15 where disposing the thermally conductive member in the interstitial space between the upper surface of the semiconductor package and the lower surface of the thermal member may include: disposing the thermally conductive member in the interstitial space between the upper surface of the semiconductor package and the lower surface of the thermal member and proximate the upper surface of the semiconductor package.

Example 17 may include elements of any of examples 14 through 16 where disposing the thermally conductive member in the interstitial space between the upper surface of the semiconductor package and the lower surface of the thermal member may include: disposing a thermally conductive formed integral with the lower surface of the thermal member in the interstitial space between the upper surface of the semiconductor package and the lower surface of the thermal member.

According to example 18, there is provided a semiconductor package thermal control system. The system may include: means for disposing a thermally conductive member in an interstitial space between an upper surface of a semiconductor package and a lower surface of a thermal member, the thermally conductive member disposed proximate a first portion of the upper surface of the semiconductor package having a first thermal output that is greater than a second thermal output of a second portion of the upper surface of the semiconductor package; and means for disposing a thermal interface material (TIM) in the interstitial space between the upper surface of the semiconductor package and the lower surface of the thermal member such that a force exerted by the TIM on the first portion of the upper surface of the semiconductor package is greater than a force exerted by the TIM on the second portion of the upper surface of the semiconductor package.

Example 19 may include elements of example 18 where the means for disposing the thermally conductive member in the interstitial space between the upper surface of the semiconductor package and the lower surface of the thermal member may include: means for disposing the thermally conductive member in the interstitial space between the upper surface of the semiconductor package and the lower surface of the thermal member and proximate the lower surface of the thermal member.

Example 20 may include elements of any of examples 18 or 19 where the means for disposing the thermally conductive member in the interstitial space between the upper surface of the semiconductor package and the lower surface of the thermal member may include: disposing the thermally conductive member in the interstitial space between the upper surface of the semiconductor package and the lower surface of the thermal member and proximate the upper surface of the semiconductor package.

Example 21 may include elements of any of examples 18 through 20 where the means for disposing the thermally conductive member in the interstitial space between the upper surface of the semiconductor package and the lower surface of the thermal member may include: means for disposing a thermally conductive formed integral with the lower surface of the thermal member in the interstitial space between the upper surface of the semiconductor package and the lower surface of the thermal member.

According to example 22, there is provided an electronic device. The device may include: a printed circuit board; a semiconductor package coupled to the printed circuit board, the semiconductor package having an upper surface and a lower surface; wherein, in operation, a first portion of the upper surface of the semiconductor package provides a first thermal output; and wherein, in operation, a second portion of the upper surface of the semiconductor package produces a second thermal output, the second thermal output less than the first thermal output; a thermal member having a lower surface spaced apart from the upper surface of the semiconductor package to form an interstitial space between the thermal member and the semiconductor package; a thermally conductive member disposed in the interstitial space, proximate at least the first portion of upper surface of the semiconductor package; a thermal interface material (TIM) disposed in the interstitial space between the thermal member and the semiconductor package such that: the TIM disposed between the thermal member and the first portion of the upper surface of the semiconductor package has a first thickness; and the TIM disposed between the thermal member and the second portion of the upper surface of the semiconductor package having a second thickness that is greater than the first thickness; and a housing disposed at least partially about the printed circuit board.

Example 23 may include elements of example 22 where at least a portion of the thermally conductive member comprises a thermally conductive member disposed proximate the lower surface of the thermal member.

Example 24 may include elements of any of examples 22 or 23 where at least a portion of the thermally conductive member comprises a thermally conductive member formed integral with and projecting from the lower surface of the thermal member.

Example 25 may include elements of any of examples 22 through 24 where at least a portion of the thermally conductive member comprises a thermally conductive member disposed proximate the upper surface of the semiconductor package.

Example 26 may include elements of any of examples 22 through 25 where the thermally conductive member comprises one or more materials having a thermal conductivity equal to or greater than the thermal conductivity of the thermal member.

Example 27 may include elements of any of examples 22 through 26 where the thermally conductive member comprises one or more materials having a thermal conductivity equal to or greater than the thermal interface material.

Example 28 may include elements of any of examples 22 through 27 where the thermal conductivity of the thermal member and the first thickness of TIM is greater than the thermal conductivity of the second thickness of TIM.

Example 29 may include elements of any of examples 22 through 28 where a first force exerted on the first portion of the upper surface of the semiconductor package is greater than a second force exerted on the second portion of upper surface of the semiconductor package.

Example 30 may include elements of any of examples 22 through 29 where the TIM comprises a slurry of particles having a relatively high thermal conductivity disposed in a relatively low thermal conductivity carrier material.

Example 31 may include elements of any of examples 22 through 30 where the thermally conductive member comprises a copper member.

Example 32 may include elements of any of examples 22 through 31 where the thermally conductive member comprises a member having a thickness of from about 10 micrometers (μm) to about 50 μm.

Example 33 may include elements of any of examples 22 through 32 where the first portion of the upper surface of the semiconductor package comprises a portion of the upper surface of the semiconductor package proximate a central processing unit (CPU) semiconductor die.

Example 34 may include elements of any of examples 22 through 33 where the thermal member comprises a cold plate.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

What is claimed:

1. An electronic device, comprising:
a printed circuit board;
a semiconductor die coupled to the printed circuit board, the semiconductor die having an upper surface and a lower surface, a first portion of the semiconductor die produces a first thermal output when the semiconductor die is in operation, a second portion of the semiconductor die produces a second thermal output when the semiconductor die is in operation, the second thermal output less than the first thermal output;
a thermal member having a lower surface spaced apart from the upper surface of the semiconductor die, an interstitial space between the thermal member and the semiconductor die, the lower surface of the thermal member spaced apart from the upper surface of the semiconductor die by a first distance;
a thermally conductive member in the interstitial space, the thermally conductive member at least partially between the first portion of the semiconductor die and the lower surface of the thermal member, the thermally conductive member extending a second distance between the lower surface of the thermal member and the upper surface of the semiconductor die, the second distance less than the first distance;
a thermal interface material (TIM) in the interstitial space between the thermal member and the semiconductor die such that:
a first portion of the TIM between the thermal member and the first portion of the upper surface of the semiconductor die having a first thickness corresponding to a difference between the first distance and the second distance; and
a second portion of the TIM between the thermal member and the second portion of the semiconductor die having a second thickness that is greater than the first thickness, the second thickness corresponding to the first distance such that the TIM contacts both the lower surface of the thermal member and the upper surface of the semiconductor die, the first and second portions of the TIM corresponding to different portions of a continuous segment of the TIM; and
a housing at least partially about the printed circuit board.

2. The electronic device of claim 1, wherein at least a portion of the thermally conductive member is proximate to the upper surface of the semiconductor die.

3. The electronic device of claim 1, wherein the thermally conductive member includes one or more materials having a first thermal conductivity, the thermal member having a second thermal conductivity, the first thermal conductivity equal to or greater than the second thermal conductivity.

4. The electronic device of claim 1, wherein the thermally conductive member includes one or more materials having a first thermal conductivity, the TIM having a second thermal conductivity, the first thermal conductivity equal to or greater than the second thermal conductivity.

5. The electronic device of claim 1, wherein the thermal member has a first thermal conductivity, the first portion of the TIM has a second thermal conductivity, and the second portion of the TIM has a third thermal conductivity, the first thermal conductivity and the second thermal conductivity being greater than the third thermal conductivity.

6. The electronic device of claim 1, wherein a first pressure exerted on the first portion of the upper surface of the semiconductor die is greater than a second pressure exerted on the second portion of the upper surface of the semiconductor die.

7. The electronic device of claim 1, wherein the TIM includes a slurry of particles having a first thermal conductivity in a carrier material having a second thermal conductivity, the first thermal conductivity higher than the second thermal conductivity.

8. The electronic device of claim 1, wherein the thermally conductive member includes copper.

9. The electronic device of claim 1, wherein the thermally conductive member has a thickness of from about 1 micrometers (μm) to about 2 millimeters (mm).

10. The electronic device of claim 1, wherein the first portion of the upper surface of the semiconductor die includes a region of the upper surface of the semiconductor die proximate a central processing unit (CPU) semiconductor die.

11. The electronic device of claim 1, wherein the thermal member includes a cold plate.

12. The electronic device of claim 1, wherein at least a portion of the thermally conductive member is proximate the lower surface of the thermal member.

13. The electronic device of claim 12, wherein at least a portion of the thermally conductive member is integral with and projects from the lower surface of the thermal member.

14. The electronic device of claim 1, wherein the thermally conductive member is spaced apart from an area of the interstitial space between the second portion of the semiconductor die and the lower surface of the thermal member.

15. The electronic device of claim 1, wherein the thermally conductive member is enclosed by the TIM and one of the upper surface of the semiconductor die or the lower surface of the thermal member.

16. The electronic device of claim 1, wherein the thermally conductive member has a first surface, a second surface opposite the first surface, and a lateral surface extending between the first surface and the second surface, the first surface of the thermally conductive member interfacing with one of the upper surface of the semiconductor die or the lower surface of the thermal member, the TIM interfacing with the second surface and the lateral surface of the thermally conductive member.

17. The electronic device of claim 1, wherein the thermally conductive member has a lower compressibility than the TIM.

18. The electronic device of claim 1, wherein the thermally conductive member has a first width, the TIM has a third width, and the upper surface of the semiconductor die has a second width, the first width less than the second width, the first width less than the third width.

19. The electronic device of claim 18, wherein the second width corresponds to the third width.

* * * * *